United States Patent
Miki et al.

(10) Patent No.: US 7,989,843 B2
(45) Date of Patent: Aug. 2, 2011

(54) SEMICONDUCTOR AND METHOD FOR PRODUCING THE SAME

(75) Inventors: Kazushi Miki, Ibaraki (JP); Shuhei Yagi, Ibaraki (JP); Kohichi Nittoh, Ibaraki (JP); Kunihiro Sakamoto, Tokyo (JP)

(73) Assignee: National Institute For Materials Science, Ibaraki (JP)

( * ) Notice: Subject to any disclaimer, the term of this patent is extended or adjusted under 35 U.S.C. 154(b) by 180 days.

(21) Appl. No.: 12/310,396

(22) PCT Filed: Aug. 27, 2007

(86) PCT No.: PCT/JP2007/066584
§ 371 (c)(1),
(2), (4) Date: Apr. 29, 2009

(87) PCT Pub. No.: WO2008/023821
PCT Pub. Date: Feb. 28, 2008

(65) Prior Publication Data
US 2009/0200643 A1    Aug. 13, 2009

(30) Foreign Application Priority Data

Aug. 25, 2006  (JP) .................................. 2006-228592
Aug. 25, 2006  (JP) .................................. 2006-228593

(51) Int. Cl.
*H01L 31/00* (2006.01)
(52) U.S. Cl. ................. 257/192; 257/E29.184; 438/305
(58) Field of Classification Search ............. 257/12, 257/192, 194, E29.184; 438/305, 372
See application file for complete search history.

(56) References Cited

U.S. PATENT DOCUMENTS 5,183,777 A    2/1993  Doki et al.
2004/0217375 A1*  11/2004  Yokogawa et al. ......... 257/192

FOREIGN PATENT DOCUMENTS

| EP | 0 183 164 | 6/1986 |
| JP | 61-166081 | 7/1986 |
| JP | 2-132823 | 5/1990 |
| JP | 6-283432 | 10/1994 |

(Continued)

OTHER PUBLICATIONS

Translation of JP2002025921A downloaded from JPO on Dec. 16, 2010.*

(Continued)

*Primary Examiner* — Thomas L Dickey
(74) *Attorney, Agent, or Firm* — Wenderoth Lind & Ponack, L.L.P.

(57) ABSTRACT

A method produces a semiconductor by conducting superimposed doping of a plurality of dopants in a semiconductor substrate, which includes evaporating a (2×n) structure by a first dopant and forming its thin line structure on the substrate, then bringing the semiconductor substrate to a temperature capable of epitaxial growth, vapor depositing a second or third or subsequent dopants above the semiconductor substrate where the first dopant has been deposited, then epitaxially growing a semiconductor crystal layer over the semiconductor substrate, subsequently forming a superimposed doping layer composed of the first, second, or the third or subsequent dopants in the semiconductor substrate, and applying an annealing treatment to the superimposed doping layer at a high temperature, thereby activating the plurality of dopants electrically or optically. Superimposed doping of a plurality kinds of elements as dopants is performed to a predetermined depth in the case of an elemental semiconductor.

16 Claims, 19 Drawing Sheets

EP  epitaxially grown layer
DLT  2-element superimposed doping layer
SB  elemental semiconductor substrate
DV  semiconductor device DST1 concentration distribution of dopant element 1
SD1 distribution width of dopant element 1
ER deviation for superimposed position
SD2 distribution width of dopant element 2
DST2 concentration distribution of dopant element 2

FOREIGN PATENT DOCUMENTS

| | | |
|---|---|---|
| JP | 9-171963 | 6/1997 |
| JP | 2000-3877 | 1/2000 |
| JP | 2001-53270 | 2/2001 |
| JP | 2002-25921 | 1/2002 |
| JP | 2002025921 A * | 1/2002 |

OTHER PUBLICATIONS

J. H. G. Owen et al., "Self-Assembled Nanowires on Semiconductor Surfaces", J. Mater Sci. 41, (2006), pp. 4568-4603.

J. H. G. Owen et al., "One-Dimensional Epitaxial Growth of Indium on a Self-Assembled Atomic-Scale Bismuth Template", Nanotechnology 17, Institute of Physics Publishing, Dec. 14, 2005, pp. 430-433.

Shuhei Yagi et al., "Surface Bismuth Removal After Bi Nanoline Encapsulation in Silicon", Surface Science 595, (2005), pp. L311-L317.

J. H. G. Owen et al., "Stress Relief as the Driving Force for Self-Assembled Bi Nanolines", Physical Review Letters, vol. 88, No. 22, Jun. 3, 2002, pp. 226104-1-226104-4.

K. Miki et al., "Bismuth and Antimony Nanolines in a Si Epitaxial Layer", Inst. Phys. Conf. Ser. No. 164, Mar. 22-25, 1999, pp. 167-170.

K. Miki et al., "Atomically Perfect Bismuth Lines on Si(001)", Physical Review B, vol. 59, No. 23, Jun. 15, 1999, pp. 14868-14871.

K. Miki et al., "Bismuth-Induced Structures on Si(001) Surfaces", Surface Science 421, (1999), pp. 397-418.

International Search Report mailed Nov. 6, 2007 for International Application No. PCT/JP2007/066584.

* cited by examiner

D1 1-dimensional electron beam diffraction line

SEMICONDUCTOR AND METHOD FOR PRODUCING THE SAME

BACKGROUND OF THE INVENTION

1. Technical Field

The present invention relates to a semiconductor having a superimposed doping layer of a plurality of element dopants and a method for producing the same.

2. Background Art

A doping technique for a semiconductor device is essential as a process for manufacturing a semiconductor device. As a method of doping, a δ-doping technique has been known which is used as an effective method for improving the operation speed of a high mobility transistor. The method is based on that provision of a doping layer at the level of an atomic layer near the hetero interface enables to inject carriers in the vicinity of the interface while avoiding alloy scattering due to a dopant. In a case of a compound semiconductor, the δ-doping technique can be realized easily. For example, in a compound semiconductor comprising group III and group V elements, since elements of groups III and group V are stacked alternately, dopant elements doped to the group III layer tend to be suppressed from diffusion by the stacking of the group V element layer.

In the δ-doping technique described above, when the dopant not of a single element but dopants of plurality of elements can be superimposed, the range of utilization as a process in the manufacture of the semiconductor device is extended. For example, the following existent examples can be mentioned for compound semiconductors. At first, in an example reported for compound semiconductors, an effect of making the interface of the δ-doping layer steep has been reported ["Compound semiconductor crystal and growing method thereof" (Patent Document 1)]

Alternatively, this can be utilized also for interaction between the state of spin and a conduction electron in a semiconductor. For example, Non-Patent Document 1 demonstrates the ferromagnetic order by confining conduction electrons using a hetero structure thereby strengthening interaction with the state of spin as shown in FIG. 17. In this example, while δ-doping for Be atoms is used for supplying conduction electrons to the vicinity of the hetero structure, δ-doping for Mn atoms as a spin source is not conducted. It can be predicted that the ferromagnetism order can be attained without preparing the hetero structure when doping for both of them can be superimposed.

Further, as a quantum information processing device for which δ-doping for such plurality of elements is effective, an entirely optically controlled solid quantum information processing device has been proposed (Non-Patent Document 2). In this case, as shown in FIG. 18, a quantum bit S1 and a quantum bit S2 are spaced apart by an inter-quantum bit distance DSTSS so that a base function W1 and a base function W2 are not overlapped and a rotational gate operation can be conducted by an optical operation and a magnetic field operation. Further, a control bit C is spaced apart from the quantum bit S1 or the quantum bit S2 by an inter-quantum bit and control bit distance DSTSC so as not to cause overlap to between base functions WCG to W1 or WCE to W2. It is theoretically predicted that a distance of about 7 to 10 nm is sufficient for the inter-quantum bit distance DSTSS and the inter-quantum bit-control bit distance DSTSC. When the conditions are satisfied, in a case where the wave function of the bit-control bit C is excited to the excited state WCE by the optical operation, an entangled state can be formed by interaction caused between the spin of the base functions W1 and W2 of the quantum bit S1 and the quantum bit S2 through the excited state. When the rotational gate operation and the entangle state can be attained, all quantum information processing operations can be conducted (Non-Patent Document 3).

While it is intended to utilize the δ-doping technique of conducting superimposed doping of a plurality of dopants also in an elemental semiconductor such as silicon, the attainment of the δ-doping technique itself is difficult different from the compound semiconductor. For example, FIG. 19 shows an existent example of δ-doping boron in silicon as an example of using 1-element dopant. In this case, boron is at first adsorbed by about 1-atomic layer to a silicon substrate SSI to deposit a boron adsorption layer BO and then silicon in an amorphous state is deposited near a room temperature. Then, when the temperature is elevated to about 500° C. and left as it is, an amorphous silicon layer AMR conducts solid phase epitaxial growing and transforms into a crystalline silicon layer EPSI aligned with the underlying substrate silicon. The boron layer is frozen in a sandwiched state to form a δ-doping layer BD as a doping layer at the level of an atomic layer. On the other hand, in a case of a plurality of elements, an adsorption layer of a plurality of elements is used instead of the boron adsorption layer but no actual example has yet been reported. This is because δ-doping using a plurality of elements as dopants by solid phase epitaxy was difficult so far in the elemental semiconductor.

As a significant problem, it can not be said that the solid phase epitaxy is an ideal method as a technique of conducting doping to a predetermined depth. The problem in the δ-doping technique is that a doping profile prevails in silicon solid phase epitaxy during solid phase epitaxy. Further, the process requires much labor and long time. The time required for the solid epitaxy is at the order of hours while this depends on the thickness of the amorphous layer to be stacked. No actual example has yet been reported for the δ-doping technique of conducting superimposed doping for a plurality of dopants and, accordingly, it may be considered that the amount of the doping profile prevailing in solid phase epitaxy is different depending on the kind of the dopant, although this is merely a matter of speculation. Accordingly, it may be considered that control for the concentration and the distribution width is extremely difficult in the multi-element δ-doping technique that utilizes the solid phase epitaxy.

However, there may be also considered another technique of ion implantation, as a technique for superimposed doping to a predetermined depth. In this case, the implanting depth and the doping profile are determined automatically depending on the acceleration energy of implanted ions and mass of the ions. Theoretically, a plurality of element dopants can be implanted each to an identical depth.

However, also the ion implantation technique is not ideal as a technique of doping to a predetermined depth. Primarily, in the ion implantation technique, the apparatus is expensive and the implantation depth and the doping profile are determined depending on the acceleration energy of implanted ions and the mass of the ions and, further, annealing is necessary for repairing lattice damages caused upon implantation. Theoretically, while superimposed doping for a plurality of dopants of implanting a plurality of elements into a substantially predetermined depth is possible, the distribution width can not be made identical. Further, in the technique intending to determine the doping position at a nanometer scale as in the δ-doping technique, error for positioning is not possible at the order of nanometer, and deviation of the depth is fetal.

Patent Document 1: JP-A No. 2002-25921

Non-Patent Document 1: A. M. Nazmul, S. Sugahara and M. Tanaka, Physical Review, Vol. B67 (2003) pp 241308

Non-Patent Document 2: A. M. Stoneham, A. J. Fisher and P. T. Greeland, "Optically driven silicon-based quantum gates with potential for high-temperature operation", The Journal of Physics: Condensed, Matter, vol. 15, pp L447-L451, 2003

Non-Patent Document 3: N. Nielson and I. Chuang, "Quantum Computation and Quantum Information", Chmbridge University Press, 2000

SUMMARY OF THE INVENTION

In view of the situations described above, it is a basic object of the present invention to solve the problems in the prior art and establish a technique capable of doping a plurality kinds of elements as dopants to a predetermined depth also in an elemental semiconductor.

The present invention, further extends the teachings of a patented invention, that is, U.S. Pat. No. 2,929,004 owned by one of the present applicants (semiconductor device doped with a dopant and a doping method thereof, Kazushi Miki).

The formation of a new arrangement structure of dopants is a key to the process in the patented invention. Based on the concept that superimposed doping of a plurality of dopants can be attained in accordance with the method of the patented invention, a portion of the new arrangement structure can be replaced with other elements.

As a result, the present invention provides a novel invention having the features as described below.

A semiconductor of an embodiment of the present invention is directed to a semiconductor doped with dopants of a plurality of kinds of elements by superimposition in an elemental semiconductor substrate, in which an element generating a compressive strain and an element generating an expansion strain to the lattice constant of an elemental semiconductor of a substrate are doped by superposition, and at least two kinds of the elements are electrically or optically active.

An embodiment of the invention is directed to a semiconductor doped with dopants of a plurality of kinds of elements by superimposition in an elemental semiconductor substrate, in which at least two kinds of elements doped by superimposition have each half-value width for the concentration of each dopant of about 20 nm or less, and a deviation for the concentration peak positions between each other is within 2 nm, and at least two kinds of elements is electrically or optically active.

An embodiment of the invention is directed to a semiconductor wherein a superimposed doping layer includes two or more layers.

An embodiment of the invention is directed to a semiconductor that is an elemental semiconductor that is a group IV semiconductor.

An embodiment of the invention is directed to a semiconductor that is a group IV semiconductor that is a silicon crystal substrate or a silicon element-containing group IV mixed crystal semiconductor.

An embodiment of the invention is directed to a semiconductor with a concentration of a nuclear spin isomer element in the semiconductor substrate is lower by one digit or more than that of the average value in nature in the semiconductor substrate, other than the superimposed doping layer.

An embodiment of the invention is directed to a semiconductor in that one of the elements of a plurality of element dopants is a bismuth element.

An embodiment of the invention is directed to a semiconductor in that it has one or more mesa structures containing a superimposed doping layer in a plane, and a gap between a mesa structure and another mesa structure adjacent therewith is about or more than an optical wavelength.

An embodiment of the invention is directed to a semiconductor in that a spin ingredient for the portions other than the superimposed doping layer is excluded.

An embodiment of the invention is directed to a method for producing a semiconductor in which a plurality of dopants are doped by superimposition in a semiconductor substrate, characterized by evaporating a (2×n) structure by a first dopant, forming a thin line structure thereof on a substrate, then elevating the temperature of the semiconductor substrate to a level capable of epitaxial growing, vapor depositing second or third, and succeeding dopants on the semiconductor substrate deposited with the first dopant, then epitaxially growing a semiconductor crystalline layer above the semiconductor substrate, then forming a superimposed doping layer comprising first, second, third and succeeding dopants in the semiconductor substrate, and applying a high temperature annealing to the superimposed doping layer, thereby electrically or optically activating the plurality of dopants.

An embodiment of the invention is directed to a method for producing the semiconductor characterized by evaporating the (2×n) structure during deposition or after deposition of the first dopant, and heating the substrate to a temperature of forming the thin line structure thereof.

An embodiment of the invention is directed to a method for producing the semiconductor characterized by repeating the steps from vapor deposition of the first dopant to high temperature annealing for the dopant by a plurality of times so as to provide a plurality of them and providing a plurality of semiconductor crystal layers.

An embodiment of the invention is directed to a method for producing the semiconductor characterized by applying the high temperature treatment to the plurality of doping layers of the semiconductor crystal layer and the semiconductor substrate having the semiconductor crystal layer, thereby extending the width of the doping distribution.

An embodiment of the invention is directed to a method for producing the semiconductor characterized in that the semiconductor crystal layer comprises a group IV semiconductor.

An embodiment of the invention is directed to a method for producing the semiconductor characterized in that the group IV semiconductor is silicon.

An embodiment of the invention is directed to a method for producing the semiconductor characterized in that the first dopant is bismuth.

As described above according to the present invention, superimposed doping can be applied to an elemental semiconductor substrate such as of silicon which was difficult so far and, further, a semiconductor having a doping layer at high concentration can be attained.

More specifically, according to the invention, superimposed doping of a plurality of dopants can be attained while suppressing surface segregation of doping in the elemental semiconductor such as silicon, with no use of expensive apparatus such as an ion implantation apparatus and with no requirement for extra processing time by using a usual crystal growing apparatus. Further, superimposed doping is possible, in principle, at the level of an atomic layer and deviation of the concentration distribution for a plurality of superimposed dopants can be decreased substantially to zero in principle.

Accordingly, it is possible to restrict the concentration distribution width of plural dopants at least to 20 nm or less and the deviation for the concentration distribution of the plurality of superimposed dopants within 2 nm which were considered impossible so far.

Further, since such stable superimposed dopant is possible, a superimposed doping layer of a plurality of element dopants having a profile width at the order of an atomic layer can be formed in an elemental semiconductor according to the present invention.

This extends the range of application as the process in view of the manufacture of the semiconductor device.

(1) In a case of using a doping layer as a simple conduction carrier (electron or hole) generation source, a superimposed doping layer where a plurality of dopants generating compression strain and expansion strain to the lattice constant of an elemental semiconductor are present together can be attained and a semiconductor device having a doping layer at high concentration can be provided.

(2) While n-type and p-type dopants have been mainly considered in elemental semiconductors so far, a magnetic semiconductor device having an interaction between conduction electrons and spin can be provided by superimposing a magnetic impurity and a carrier generation source to an identical doping layer.

(3) Further, in a case of considering all impurity elements taking a localized electron state as the dopant, a quantum information processing device having a superimposed doping layer of a localized state dopant for keeping a specified state of spin or causing an inter-spin action by utilizing a third localized state can be provided.

As described above, applications are possible in various fields such as semiconductor devices, magnetic semiconductor devices, and quantum information processing devices.

DESCRIPTION FOR REFERENCES

Figure 1:
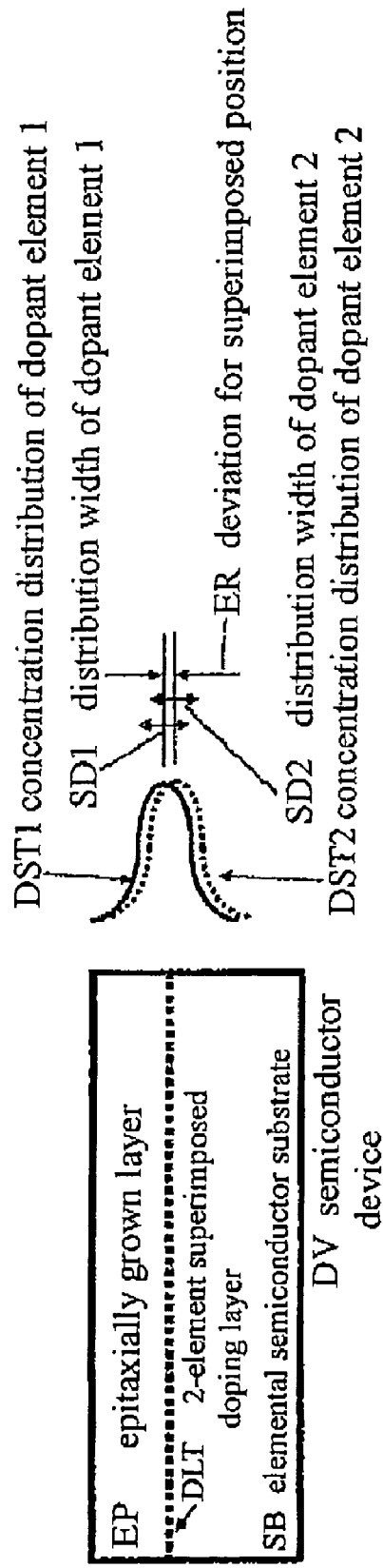
FIG. 1 is an explanatory view for a basic example of the invention.

SB elemental semiconductor substrate
EP epitaxially grown layer
DLT 2-element superimposed doping layer
DST1 concentration distribution of dopant element 1
DST2 concentration distribution of dopant element 2
SD1 distribution width of dopant element 1
SD2 distribution width of dopant element 2
ER deviation for superimposed position
SS special structure of dopant first element
DP1 dopant first element
DP2 dopant second element
CP dopant substitution position
DD1 first element dopant
DD2 second element dopant
T1 substrate temperature for forming a surface structure of the dopant first element
T2 substrate temperature for epitaxial growing of silicon
t1 time for forming a surface structure of the dopant first element
t2 vapor deposition time for a dopant second element
t3 time for epitaxially growing silicon
t4 time for epitaxially growing silicon
1 crystal growing apparatus
10 vacuum vessel
11 high speed electron beam source
11i high speed electron incident beam
11d diffraction beam
12 fluorescent screen
13a material supply device
13b dopant material supply device
13c dopant material supply device
14 shutter
15 heater
SSI silicon substrate
L bismuth thin line
DI electron beam diffraction line
BI bismuth atom
SI silicon atom
SSL surface segregation layer
DST1 inter-bismuth element distance
DST2 inter-different dopant element distance
PT surface of crystal growing layer
PD position for 2-element superimposed doping layer
pEr1 concentration peak of erbium in a 2-element superimposed doping layer
pBi1 concentration peak of bismuth in a 2-element superimposed doping layer
pEr2 concentration peak of erbium in surface segregation layer
pBi2 concentration peak of bismuth in surface segregation layer
Per erbium excited peak
Pbi bismuth excitation peak
DX distance in direction X
DY distance in direction Y
MS mesa structure
PL quantum information processing device
MST rectangular mesa structure
W1 electron base state of quantum bit atom W2 electron base state of quantum bit atom
WCE electron excited state of control bit atom
WCG electron base state of control bit atom
C control bit
S1 quantum bit 1
S2 quantum bit 2
DSTSS inter-quantum bit distance
DSTSC inter-quantum bit-control bit distance
BO boron adsorption layer
AMR amorphous silicon layer
EPSI silicon crystal layer
BD boron
δ doping layer

DETAILED DESCRIPTION OF THE INVENTION

Explanatory View for Principle

FIG. 1 shows a structure for the present invention. This concerns a semiconductor device in which an epitaxially grown layer EP is disposed above an elemental semiconductor SB while sandwiching a 2-element superimposed doping layer DLT therebetween. It may be a magnetic semiconductor device or a quantum information processing device. In FIG. 1, a semiconductor device DV is shown. In the 2-element superimposed doping layer DLT, a dopant element 1 and a dopant element 2 are present together. The concentration distribution widths for two kinds of dopant elements respectively have different distribution widths as DST1 and DST2, each of which is 20 nm or less. Further, deviation ER for the central peak position of the concentration distributions for two kinds of dopant elements is 2 nm or less.

Figure 2:
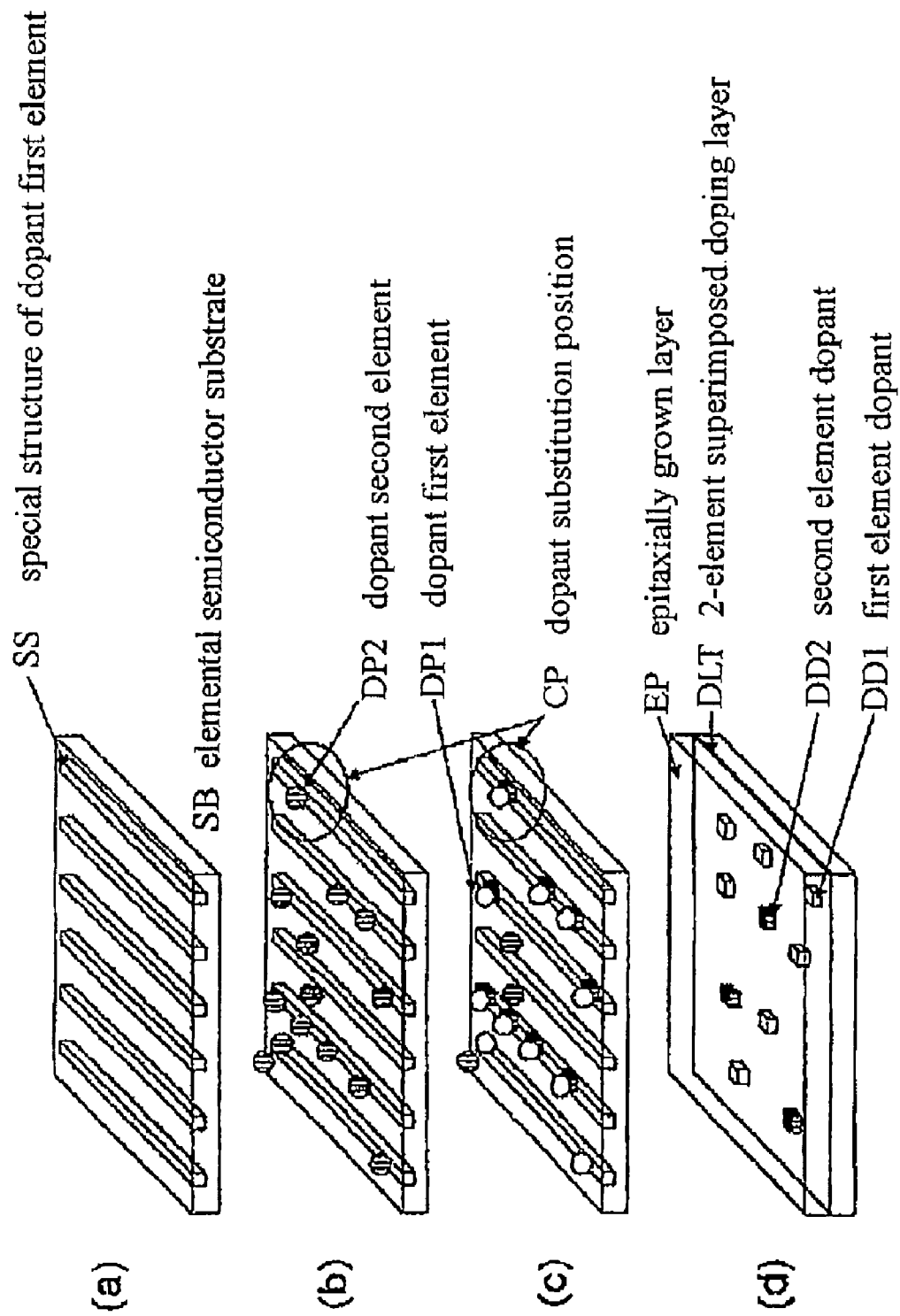
FIG. 2 is an explanatory view for a basic preparation procedure of the invention.

FIG. 2 shows a process for manufacturing the structure of the invention. At first, a special surface structure SS of a first dopant element DP1 is formed on the surface of an elemental semiconductor substrate SB [FIG. 2(a)]. When a second dopant element DP2 is vapor deposited to the surface [FIG. 2(b)], a portion of the first dopant element DP1 and the second dopant element DP2 can be substituted at the substitution position CP over the surface structure SS [FIG. 2(c)]. When an epitaxial layer EP of an element of the elemental semiconductor is grown on the surface, while most of the first dopant element and the second dopant element cause surface segregation, a portion of the first dopant element DD1 and the second dopant element DD2 remains as the superimposed doping layer DLT. What remains is a portion of the first dopant element forming a special structure and the second dopant element substituting for the first dopant element forming the special structure. By the series of processes, the superimposed doping layer of the first element dopant and the second element dopant having a profile width at the order of the atomic layer can be formed in the elemental semiconductor substrate SB. Upon vapor deposition of the second element dopant, when the third and the succeeding dopants are vapor deposited as well, three or more kinds of dopants can be formed as a superimposed doping layer in the elemental semiconductor SB. The obtained superimposed doping layer can be electrically or optically activate by a thermal annealing treatment.

When an epitaxial layer EP of the element of the elemental semiconductor is grown on the surface, while most of the first dopant element and the second dopant element cause surface segregation, a portion of the first dopant element DD1 and the second dopant element DD2 remains as the superimposed doping layer DLT. What remain is a portion of the first dopant element forming the special structure and the second dopant element substituting for the first dopant element forming the special structure. By the series of the process, a superimposed doping layer of the first element dopant and the second element dopant having the profile width at the order of the atomic layer can be formed in the elemental semiconductor SB. Upon vapor deposition of the second element dopant, when the third or succeeding dopants are also vapor deposited further, a superimposed doping layer comprising three kinds or more of the dopants can be formed in the elemental semiconductor SB. The obtained superimposed doping layer can be activated electrically or optically by a thermal annealing treatment. The electrical activation and the optical activation can be recognized by conducting measurement for electric conductivity—hall of the obtained superimposed doping layer, or by photoluminescence measurement which is to be described later with reference to FIG. 12. It may suffice that the first dopant element, the second element dopant, or the third and succeeding dopant elements of the superimposed doping layer are situated at the silicon substitution position and, so long as defects of causing electric scattering or defects of causing light absorption are removed, electrical activation and optical activation can be detected by the measuring method described above. Since the number of electrically active carriers activation ratio can also be evaluated in comparison with the concentration of the first dopant element, the second element dopant, or the third and succeeding dopant elements of the superimposed doping layer obtained by secondary ion mass spectroscopy as described with reference to FIG. 9.

In the following examples, while Bi (bismuth)-Er (erbium) and Bi (bismuth)-Sb(antimony) are exemplified as a combination of the first dopant element and the second dopant element, they are not restrictive. Usually, they are considered preferably as a combination of III-V, V-V, etc for group III and group V elements. The group III elements includes, for example, lanthanoid elements including Er (erbium), rare earth elements including Y (yttrium), Sc (scandium) and B, Al, Ga, In, etc. Further, the group V element includes, for example, Bi, Sb, As, and P.

In the selection of the combination, they may be an element generating the compressive strain and an element generating the expansion strain with reference to the compression strain to the lattice constant of the elemental semiconductor of the substrate.

Generally, the element generating the compression strain includes, for example, Bi, Sb, As, In, and Ga, and the elements generating the expansion strain includes, for example, B and P. Further, there may be mentioned rare earth elements such as Er or Sb, for example, to Bi.

In any case, in the selection for the combination of a plurality of element dopants, combination, for example, of a spin source and a carrier source, and carrier sources to each other that increase the carrier concentration may be considered. In the selection of the dopant elements described above, it is preferred to take a consideration for preventing silicidation.

Then, in the method for producing the superimposed doping semiconductor, semiconductors not found so far can be obtained as the object of elemental semiconductor substrates such as silicon.

The process is a simple and convenient means as the combination of vapor deposition, epitaxy by heating and, finally, activation by annealing.

Then, examples are to be shown below and description is to be made more specifically. It is apparent that the invention is not restricted by the following examples.

Example 1

Description is to be made to a first example referring to FIG. 1 and FIG. 2. This example can include a silicon (001)

crystal substrate as an elemental semiconductor substrate SB, a bismuth element as a first dopant element DP1, a bismuth thin line structure as a special surface structure SS of the first dopant element DP1, and an erbium element as the second dopant element DP2.

Figure 3:
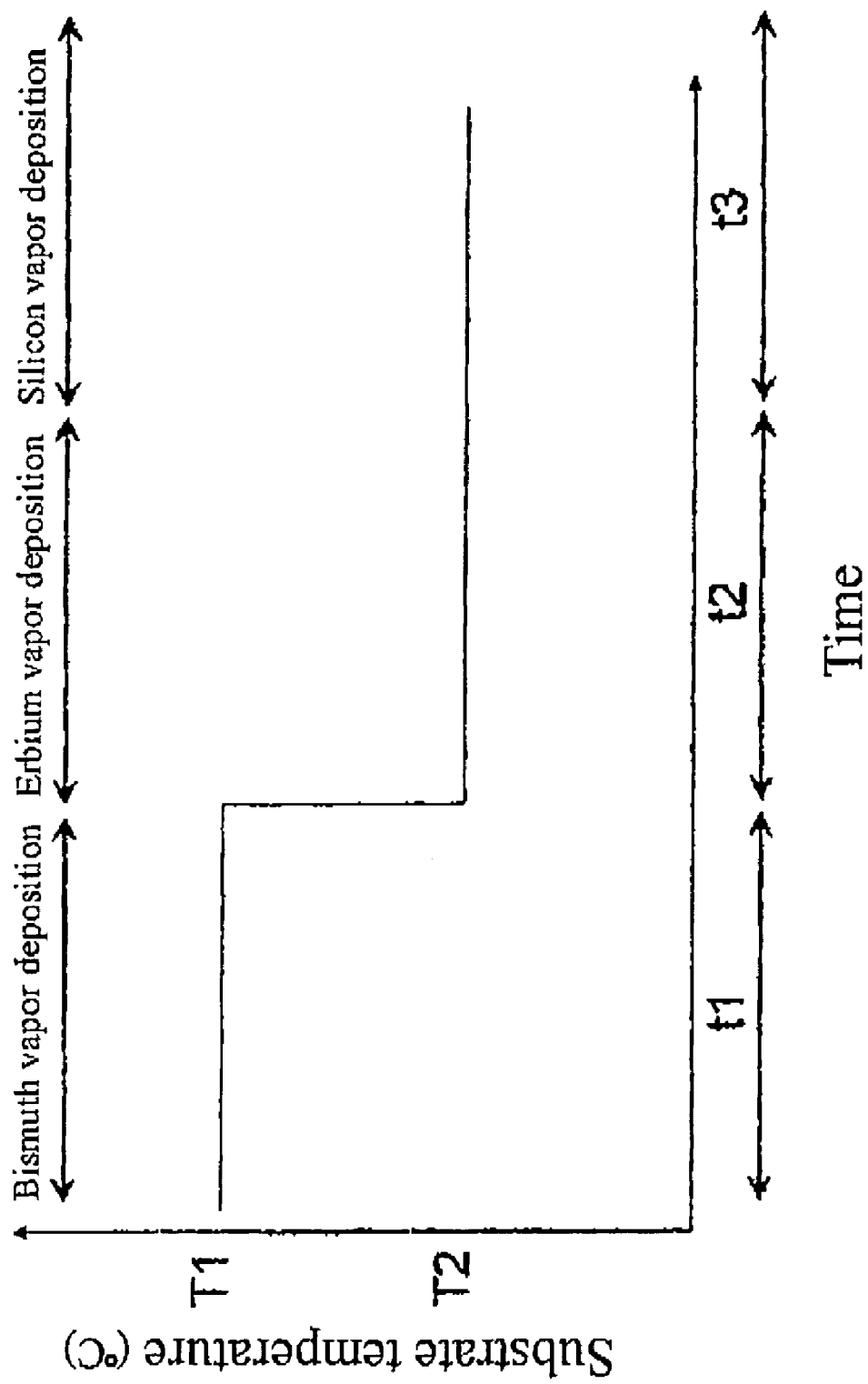
FIG. 3 is a view of procedures for a basic example of the invention.

FIG. 3 shows the processing procedures of this example. Bismuth is vapor deposited at a substrate temperature T1 over a silicon (001) substrate to form the bismuth thin line structure. T1 is selected within a range of a temperature (500° C. to 600° C.) near the evaporation temperature of bismuth from above the silicon substrate. The time for forming the bismuth thin line structure is different depending on the temperature but there is no other differences. Successively, the temperature of the substrate is lowered to T2 to conduct deposition of erbium and deposition of silicon. In the case of this example, the substrate temperature T2 was set to lower than the substrate temperature T1 within a temperature range capable of epitaxially growing silicon. Actually, it is not necessary to set the substrate temperature upon evaporation of erbium to a temperature identical with that for the silicon vapor deposition. In this example, T1 was set to 500° C. and T2 was set to 400° C.

Figure 4:
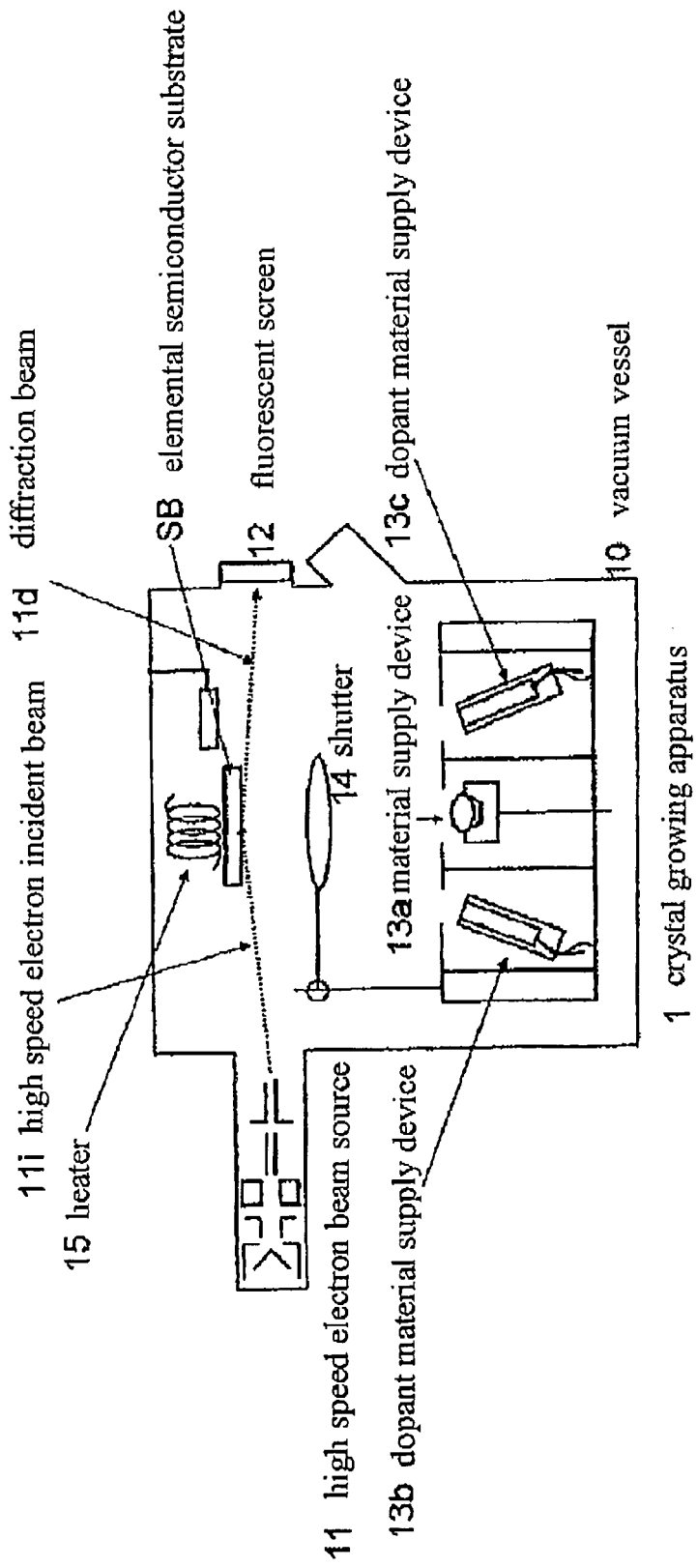
FIG. 4 is an explanatory view for a constitutional example of an apparatus for carrying out the invention.

While there is no restriction on the method of vapor depositing silicon, bismuth or the like, a heater 15, etc. is disposed as means for heating the elemental semiconductor substrate (silicon substrate) SB, and the substrate is placed in a vacuum vessel 10 evacuated by an evacuation device (not illustrated) as shown in FIG. 4. It may suffice that an apparatus has a material supply device 13a capable of vapor depositing a semiconductor material such as silicon to a silicon semiconductor substrate SB, dopant material supply device 13b, 13c capable of vapor depositing dopant materials such as bismuth and erbium, and a shutter 14 for controlling the vapor deposition time.

Upon vapor deposition of silicon, bismuth, etc., it is adapted such that the structure on an elemental semiconductor substrate (silicon substrate) SB can be examined on a real time by high speed electron beam diffraction. In the high speed electron beam diffraction, a high speed electron incident beam 11i emitted from a high speed electron beam source 11 is diffracted on an elemental semiconductor substrate (silicon substrate) SB, and an emitted diffraction beam 11d lights up a fluorescent screen 12, by which information on the surface structure can be obtained. In this example, an electron gun type evaporation source was used as a material supply device 13a for vapor deposition of silicon, a K cell type evaporation source was used as dopant material supply devices 13b, 13c for vapor deposition of bismuth and erbium, and a vapor deposition rate was set to 0.1 nm/sec, 0.0001 to 0.001 nm/sec, and 0.0001 to 0.001 nm/sec, respectively.

When bismuth is adsorbed on the surface of the silicon (001) substrate, it usually forms, a dimmer structure on a substrate as in the case of silicon, to provide a re-arranged structure referred to as a (2×n) structure. Bismuth on the surface substitutes for silicon on the uppermost surface of the substrates in a complicate manner, and at about bismuth evaporation temperature, it forms a thin line structure as a stable structure. The evaporation energy of the bismuth thin line is higher compared with that of bismuth of the (2×n) structure and, as a result, the bismuth thin line structure remains on the surface even when the (2×n) structure bismuth is evaporated. The structure can be used as a special surface structure for the dopant.

Figure 5:
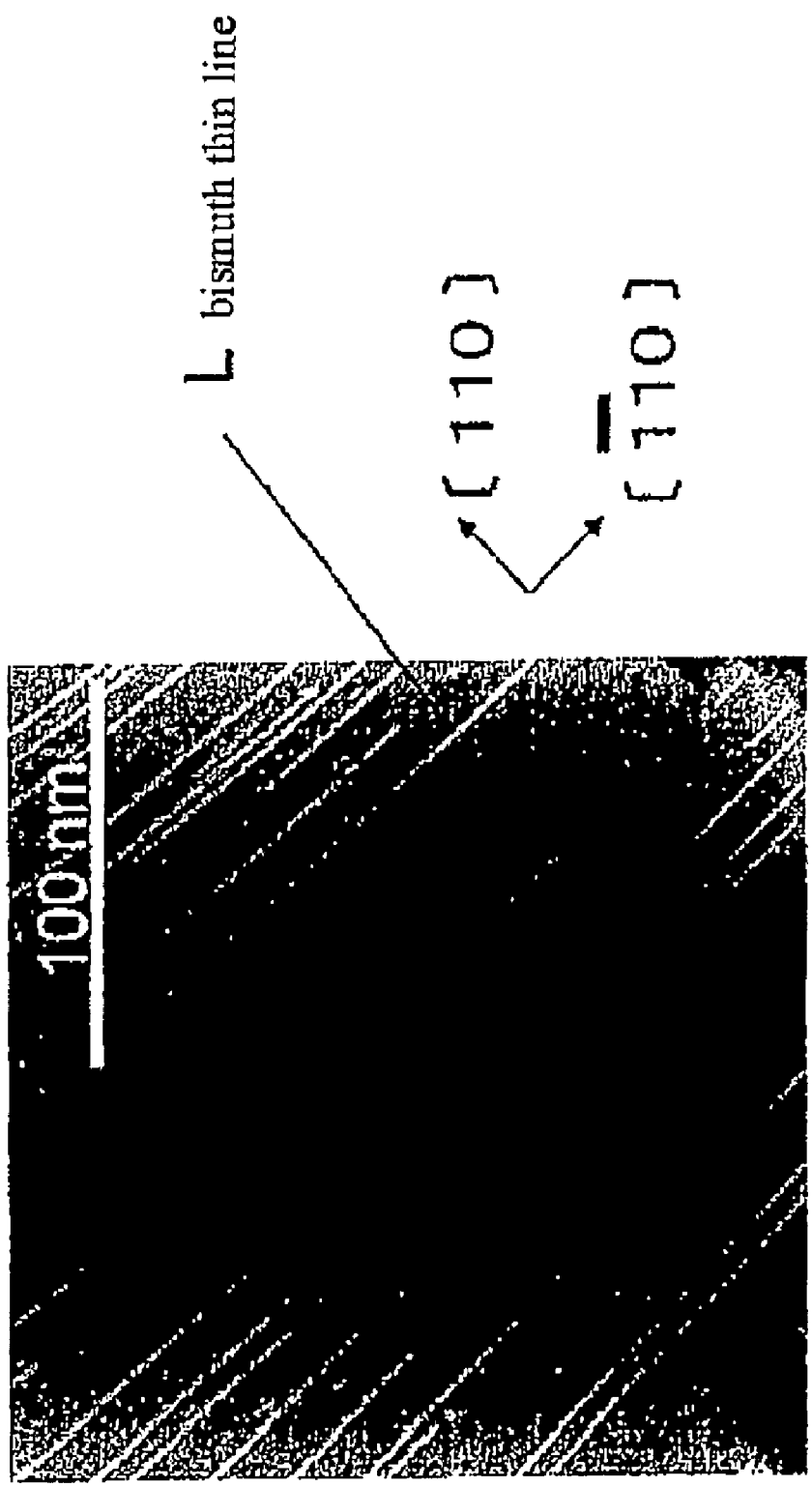
FIG. 5 shows scanning type tunnel microscopic images for a bismuth thin line structure generated in a basic example of the invention.

A bismuth thin line structure L is formed on the silicon substrate as observed by a scanning type tunnel microscopic images in FIG. 5 and remains even near the evaporation temperature. The thin line structure has a feature in that the structure is buried in the terrace on the surface of the silicon substrate. Due to this feature, it does not cause surface segregation even when silicon crystals are grown epitaxially above, and a bismuth as a portion of the thin line structure remains.

Figure 6:
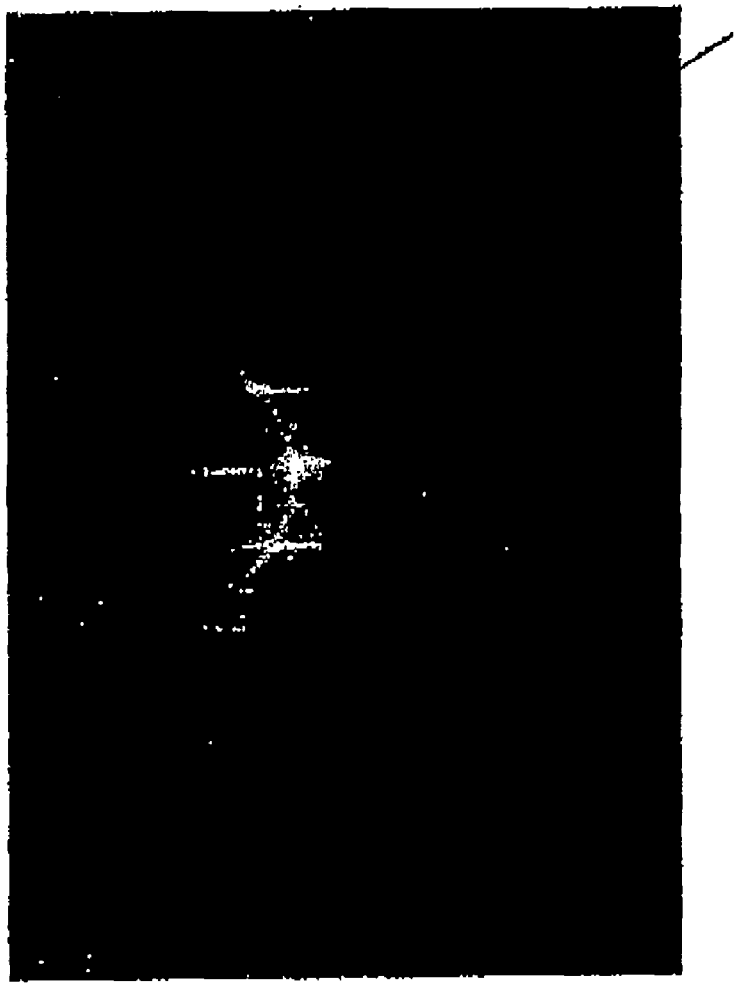
FIG. 6 is a high speed electron beam diffraction pattern of a bismuth thin line structure generated in a basic example of the invention.

The thin line structure can be confirmed by high speed election beam diffraction as semi-circular electron diffraction image DI shown in FIG. 6, and the concentration of the thin bismuth line can also be estimated based on the luminance of high speed electron beam diffraction images.

Figure 7:
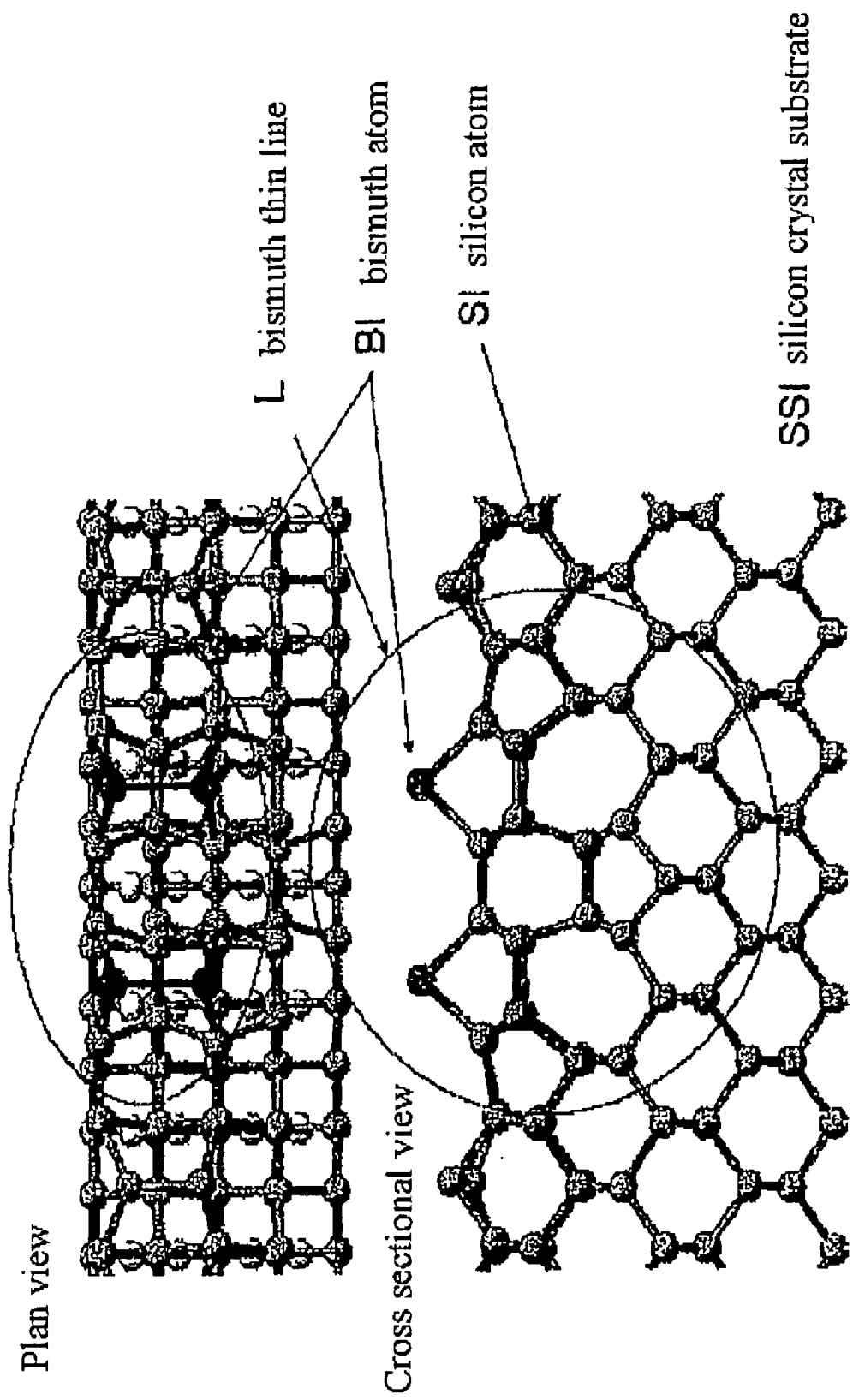
FIG. 7 is a structural model of a bismuth thin line structure generated in a basic example of the invention.

After forming the bismuth thin line as described above, by vapor depositing erbium at a substrate temperature T2 in the procedures shown in FIG. 3, a portion of bismuth atoms as the first dopant element DP1 and a portion of erbium atoms as a second dopant element DP2 can substitute on the bismuth thin line as the surface structure SS [FIG. 2(c)]. It is considered that the bismuth atoms have a large atom radius and form a bismuth thin line structure in a state of accompanying most distortion energy on silicon. FIG. 7 shows a structural model of bismuth atoms (refer to Stress relief as the driving force for self-assembled Bi nanolines, Physical Review Letters, vol. 88 (2002), p226104, J. H. G. Owen, K. Miki, H. Koh, H. W. Yoem and D. R. Bowler). In this model, due to the bismuth thin line structure, 5-membered ring and 7-membered ring structures are observed as the structures different from that of the silicon crystal observed on the side of the silicon substrate. Due to distortion of the bismuth atoms, entire energy is lowered by substituting the atom position for the erbium atom to decrease the strain energy. Judging from the atom radius of the bismuth element, it may be considered that most of dopant elements conduct substitution as in erbium.

When silicon is epitaxially grown on the surface as the element of the elemental semiconductor in the epitaxial layer ER, while most of bismuth atoms and erbium atoms cause surface segregation, a portion of them remains. What remains is a portion of the bismuth atoms forming the bismuth thin line structure and a portion of the erbium atoms substituting for the bismuth atoms forming the bismuth thin line structure.

Figure 8:
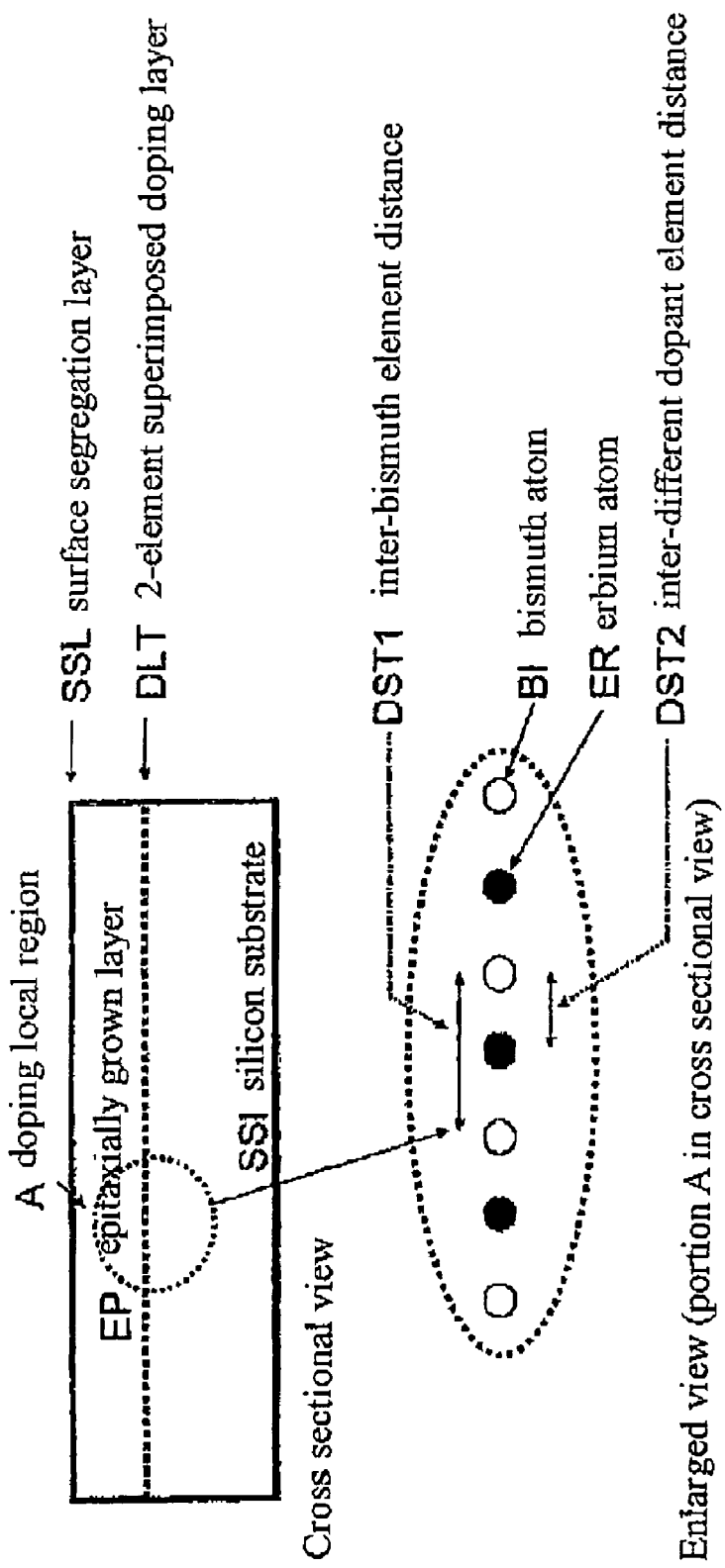
FIG. 8 is a cross sectional view of a specimen manufactured in a basic example of the invention.
Figure 9:
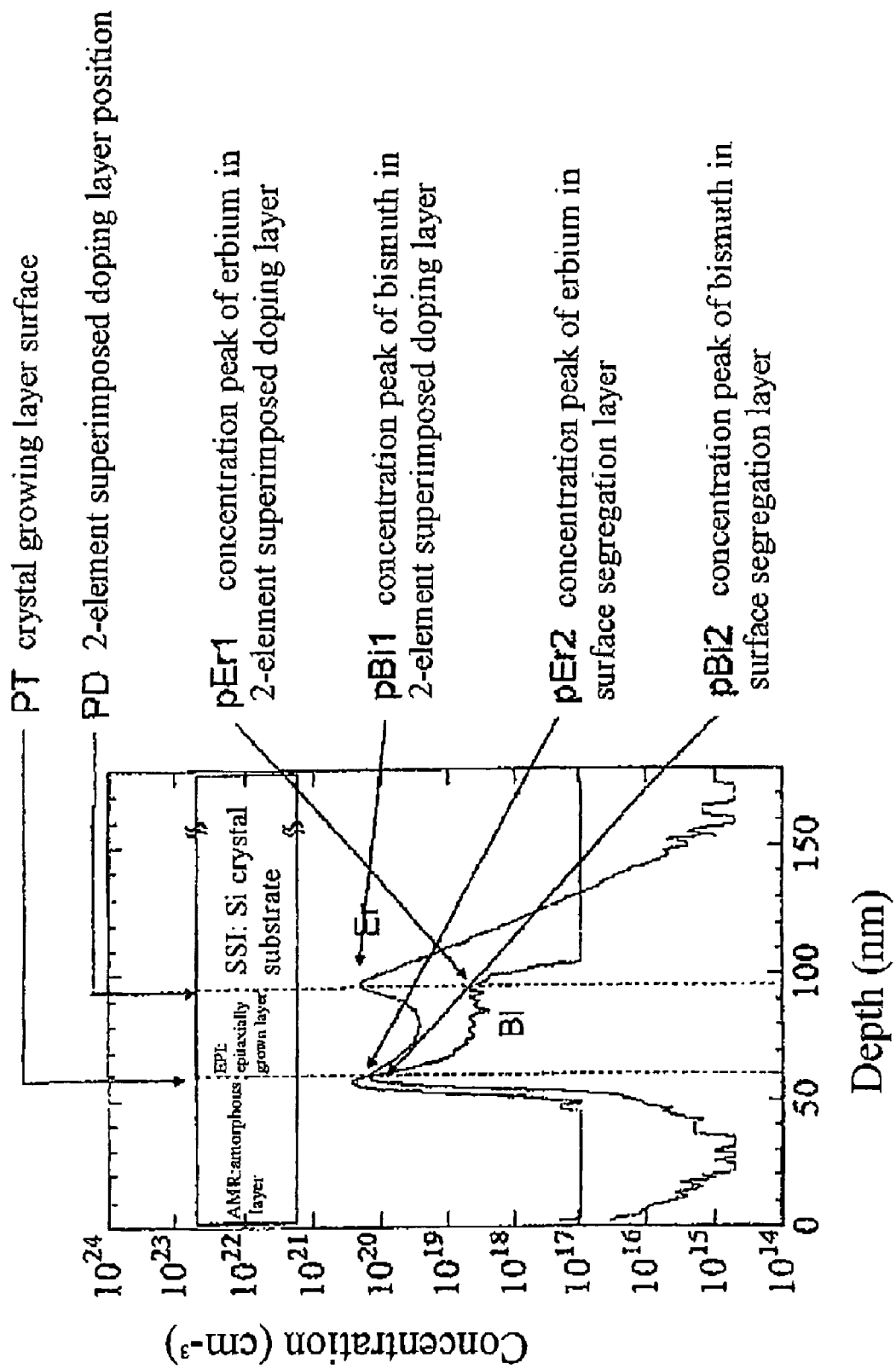
FIG. 9 is a secondary ion mass spectroscopic profile of a specimen manufactured in a basic example of the invention.

The cross sectional profile for 2-element superimposed doping obtained by the process as described above is shown in FIG. 8. A silicon epitaxially grown layer EP is present above a silicon (001) substrate SSI while sandwiching the 2-element superimposed doping layer DLT of bismuth and erbium therebetween. In the 2-element superimposed doping layer, erbium atoms ER and bismuth atoms BI are doped in a coexistent state. In this example, erbium atoms ER and bismuth atoms BI not forming the 2-element superimposed doping layer form a surface segregation layer SSL. FIG. 9 shows a bismuth concentration distribution of the specimen examined by secondary ion mass spectrometry. Distinct peaks pEr1 and pBi1 are recognized at a position PD corresponding to the 2-element superimposed doping layer. The distribution width of the dopants is due to the resolution power of secondary ion mass spectrometry. Under the observation by high speed electron beam diffraction, high speed electron beam diffraction images rapidly disappear at the instance of growth of a several atomic layer of silicon, and the actual distribution width of the dopant is considered to be at the level of the atomic layer. It can be seen from FIG. 9 that kinds of elements of bismuth atoms and erbium atoms are put to superimposed doping as dopant atoms, the half-value width for the concentration of the two kinds of elements is about 20 nm or less and the deviation of the concentration peak positions for the two kinds of the element dopants is within 2 nm. In this invention, the concentration distribution widths for the plurality of element dopants are extremely similar with each other essentially, the distribution width is as narrow as about 20 nm or less, the peak positions for the concentration distribution can be regarded substantially identical, and the deviation of the concentration peak positions is within 2 nm.

For confirming the surface segregation layer SSL of erbium atoms ER and bismuth atoms B1, after the doping process according to FIG. 3, a silicon amorphous layer was further stacked at a room temperature to freeze the surface segregation layer at the boundary between silicon amorphous and silicon crystal layers. The uppermost layer specimen structure shown in FIG. 8 corresponds to this. Peaks pEr2 and pBi2 are observed in the secondary ion mass spectrometry profile shown in FIG. 9 at a position PT corresponding to the boundary between the silicon amorphous and silicon crystal layers where the surface segregated bismuth is frozen and sandwiched.

The surface segregation layer SSL which is not necessary as the dopant layer can be eliminated. At first, it is necessary that the surface segregation layer does not remain in the epitaxial layer SSL before elimination. For decreasing the erbium atoms ER and the bismuth atoms BI remaining in the epitaxial layer SSL, it is effective to elevate the substrate temperature. In a case of bismuth, residue is reduced substantially to zero at 600° C. (refer to crystal growing method in JP No. 2053844). Since the surface segregation phenomenon shows similar temperature dependence, it may be considered that elevation of the substrate temperature is effective.

Then, for the necessary elimination of the surface segregation layer SSL, elimination can be conducted by chemical etching with sulfuric acid:hydrogen peroxide at 1:2 to 2:1, dry etching by using $SF_6$, etc.

The concentration of the erbium atoms ER and the bismuth atoms BI in the superimposed dopant layer can be controlled. In this example, vapor deposition of a 0.25 atomic layer of erbium was conducted at a substrate temperature of 400° C. In FIG. 9, concentration of the erbium atoms is higher than the concentration of the bismuth atoms. For obtaining desired erbium atom concentration and bismuth atom concentration, they can be controlled by the substrate temperature, the density of forming bismuth atom thin lines, and the deposition amount of erbium atoms being as parameters.

Figure 10:
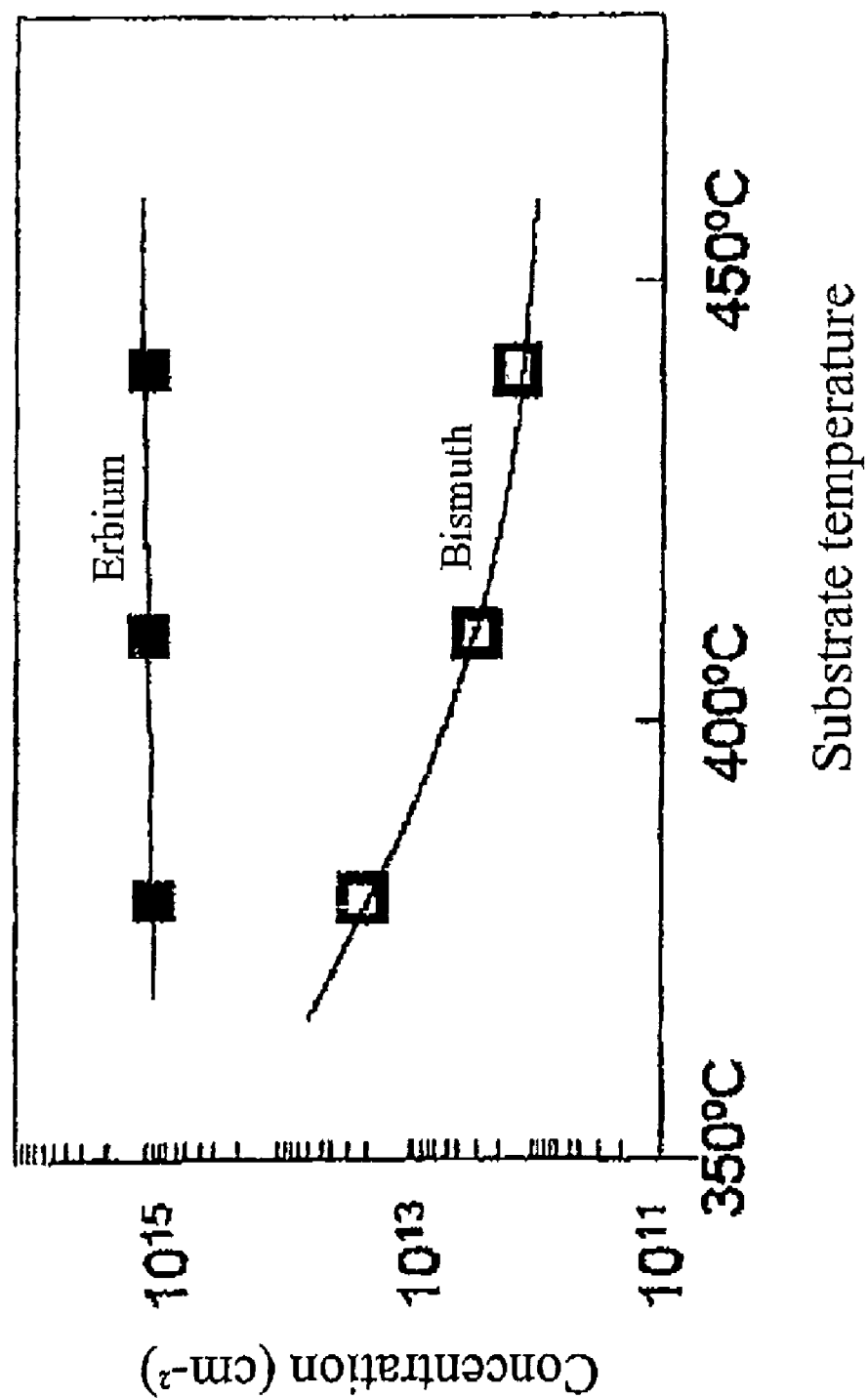
FIG. 10 is a graph showing the dependence on the substrate temperature of the dopant concentration of a specimen manufactured in a basic example of the invention.
Figure 11:
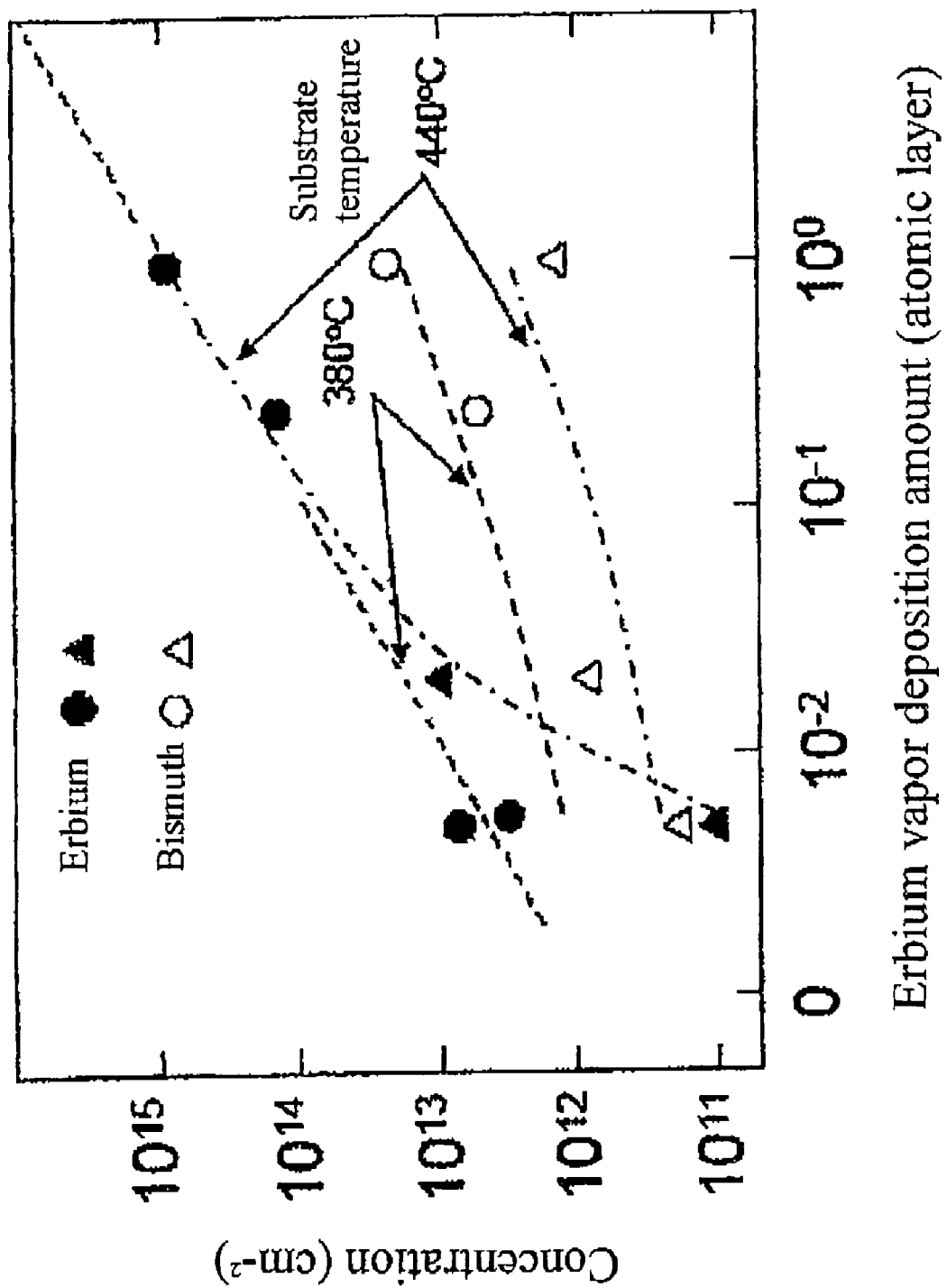
FIG. 11 is a graph showing a dependence of the dopant concentration of a specimen manufactured in a basic example of the invention on the vapor deposition amount.

Specific control examples are shown with reference to FIG. 10 and FIG. 11. FIG. 10 shows integrated values for respective concentrations obtained as a result of formation of bismuth atom thin lines and subsequent vapor deposition thereover of erbium by an 1-atomic layer, and growing crystals of silicon, and then examination on the distribution in the direction of the depth of concentrations for the erbium atoms ER and the bismuth atoms BI in the superimposed dopant layer by secondary ion mass spectrometry. While the process is identical with that described above, the vapor deposition time is controlled such that the vapor deposition amount of the erbium atoms ER is that for the 1-atomic layer. FIG. 10 shows that the concentrations of the erbium atoms ER and the bismuth atoms BI in the superimposed dopant layer change within a range of the substrate temperature from 350° C. to 450° C. upon crystal growing of silicon. In this example, while the concentration of the erbium atoms ER does not change so much it does change although slightly. The substrate temperature is due to the dependence of the surface segregation rate on the substrate temperature in the silicon crystallization. The depending on the rate of the erbium atoms ER and the bismuth atoms BI substituting for the silicon atoms in the growing layer changes depending on the substrate temperature. It has been confirmed that this occurs also due to the growing rate of silicon crystals. In this example, crystals of silicon are grown at a rate of 0.1-atomic layer/sec ($\sim 10^{15}$ N/sec) and the surface segregation rate is higher or lower when the crystal growing rate is lower or higher than growing rate described above. The surface segregation rate is determined depending on how much energy gain is obtained by the atom substitution and the gain is larger for bismuth than for erbium. This means that the remaining concentration of bismuth tends to change more greatly upon change of the crystal growing rate or the substrate temperature. Further, FIG. 11 show the change of the amount of erbium vapor deposited the bismuth atom thin lines after formation thereof, in which the content of the process is identical with that in FIG. 10. Integrated values are plotted for respective concentrations obtained as a result of examining the distribution in the direction of the depth of the erbium atoms ER and the bismuth atoms BI in the superimposed dopant layer after the process by secondary ion mass spectroscopy. It can be seen from FIG. 11 that the concentrations of the erbium atoms ER and the bismuth atoms BI in the superimposed dopant layer can be controlled by the vapor deposition amount of erbium and that the amount is also changed by the substrate temperature. This example shows that the concentrations of the erbium atoms ER and the bismuth atoms BI in the superimposed dopant layer can be controlled within the range from 0.01-atomic layer/sec to 1-atomic layer/sec ($10^{13}$ N/sec to $10^{15}$ N/sec) for each of bismuth and erbium. Since the concentrations are different depending on the substrate temperatures at 380° C. and 440° C., it can be seen that the control range increases by use of the substrate temperature in combination.

For electrically or optically activating the 2-element superimposed doping layer obtained by the method as described above, a thermal annealing process is necessary after removing the surface segregation layer. The annealing treatment was conducted by heating a silicon substrate containing a 2-element superimposed doping layer placed in a quartz tube by an external heater while flowing a nitrogen gas by 1 L/min at a normal pressure. The silicon substrate was placed on a quartz substrate holder and taken out together with the quartz substrate holder to a place at an ambient temperature after the completion of the heating.

Figure 12:
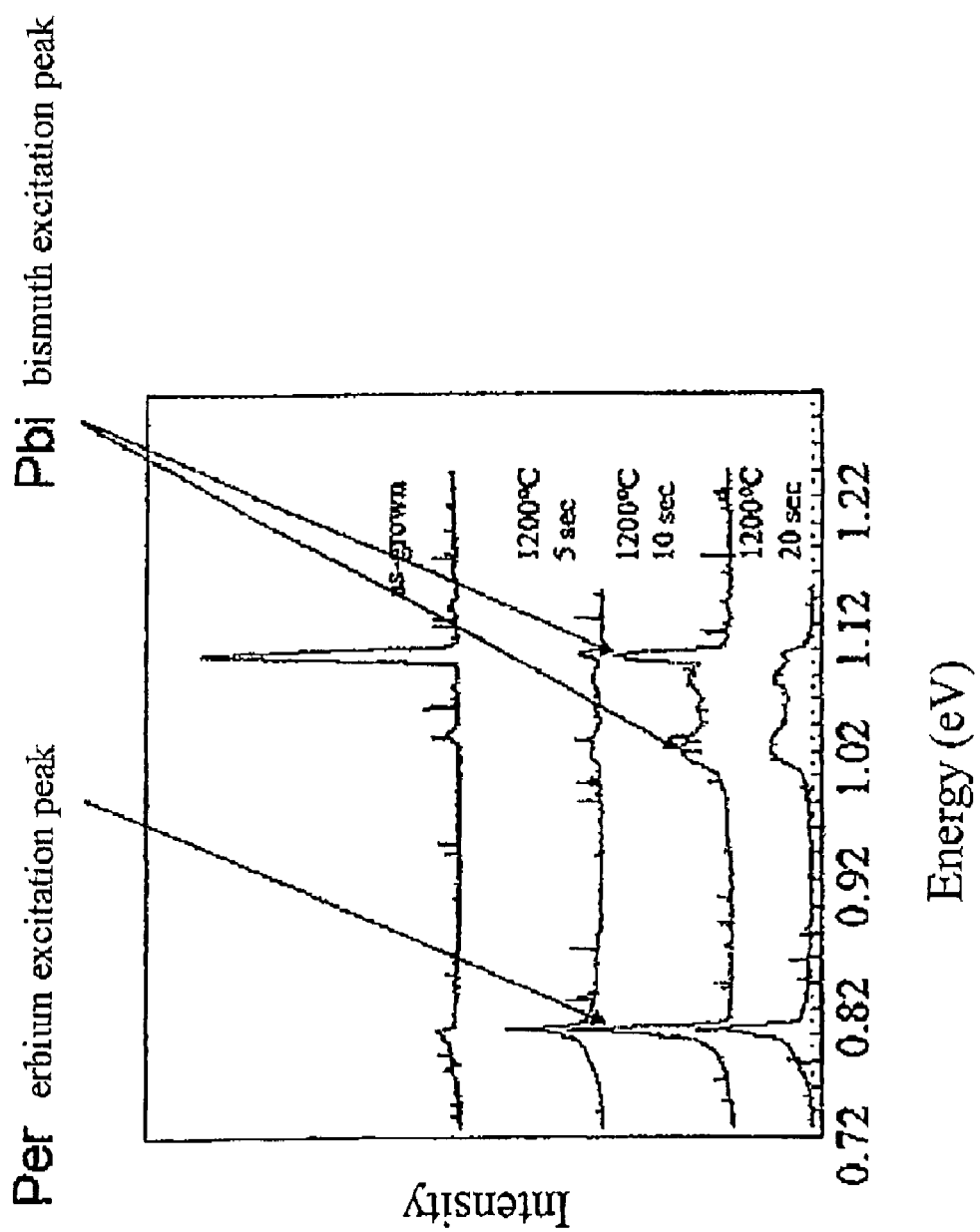
FIG. 12 is a photoluminescence spectroscopic profile of a specimen manufactured in a basic example of the invention.

FIG. 12 shows photoluminescence spectra from a silicon substrate containing a superimposed dopant layer obtained after applying a thermal annealing process at 1200° C. for 5 sec, 10 sec and 20 sec. Since the annealing temperature of the dopant optimal to electric activation is usually different, in a case of using the 2-element dopant, it is necessary to seek a condition capable of satisfying the electric activation for both dopants. However, since the melting point of the silicon crystal substrate basically defines an upper limit, it is considered that the condition may be established easily by skillfully utilizing a high speed annealing furnace or the like. In FIG. 12, a bismuth excitation peak Pbi and an erbium excitation peaks Per are observed distinctly and it is demonstrated that both the bismuth dopant and the erbium dopant are electrically or optically activated. The annealing treatment is not restricted to that in the nitrogen gas stream and can be conducted also in an inert gas such as an argon gas or in a reducing gas such as a hydrogen gas. The flow rate of the gas may be higher or lower so long as the gas flows. Further, it can be conducted not restricted to the external heater heating in the quartz tube, but also by a high speed annealing furnace. In the high speed annealing furnace utilizing an IR-ray image furnace, the conditions described above are annealing condition at 1300° C. for about 1 sec.

Manufacture of a semiconductor device having a superimposed doping layer of a plurality of element dopants having a profile width at the order of the atomic layer by utilizing the thin line structure can be conducted in the same manner as in this example, also with germanium and tin as the group IV semiconductor as with silicon, as well as with elemental semiconductors in general.

As has been already described, semiconductor devices having a superimposed doping layer with a plurality of element dopants having the profile width at the order of atomic layer can be made not only with two but also three or more element dopants by utilizing the thin line structure in the same manner as in this embodiment.

Example 2

Description is to be made for another example with reference to FIG. 1 and FIG. 2. This example can include a silicon (001) crystal substrate as an elemental semiconductor substrate SB, a bismuth element as a first dopant element DP1, a bismuth thin line structure as a special surface structure SS of the first dopant DP1, and an antimony element as a second dopant element DP2. The vapor deposition of antimony was conducted also at a substrate temperature T1 of 400° C. as in Example 1, and the total vapor deposition amount of antimony was defined as a 1-atomic layer. A report investigating the concentration distribution of the bismuth element and the antimony element in the state corresponding to FIG. 2(c) is described in the document: Bismuth and Antimony Nanoline in Si Epitaxial Layer. Microscopy of Semiconducting Materials 1999 (Edited by A G Cullis, and J. L. Hutchison, IOP Publishing Ltd., London), Inst. Phys. Conf. Ser. vol. 164 (1999), pp 167-170, K. Miki, H. Matsuhata, K. Sakamoto, J. H. G. Owen, D. R. Bowler, and G. A. D. Briggs. in the same manner as in the example, substitution occurs for the bismuth atoms and antimony atoms to a ratio of about 1:25. By conducting the process corresponding to FIG. 2(d), a semiconductor device structure having the superimposed dopant layer as in Example 1 can be attained.

Example 3

Figure 13:
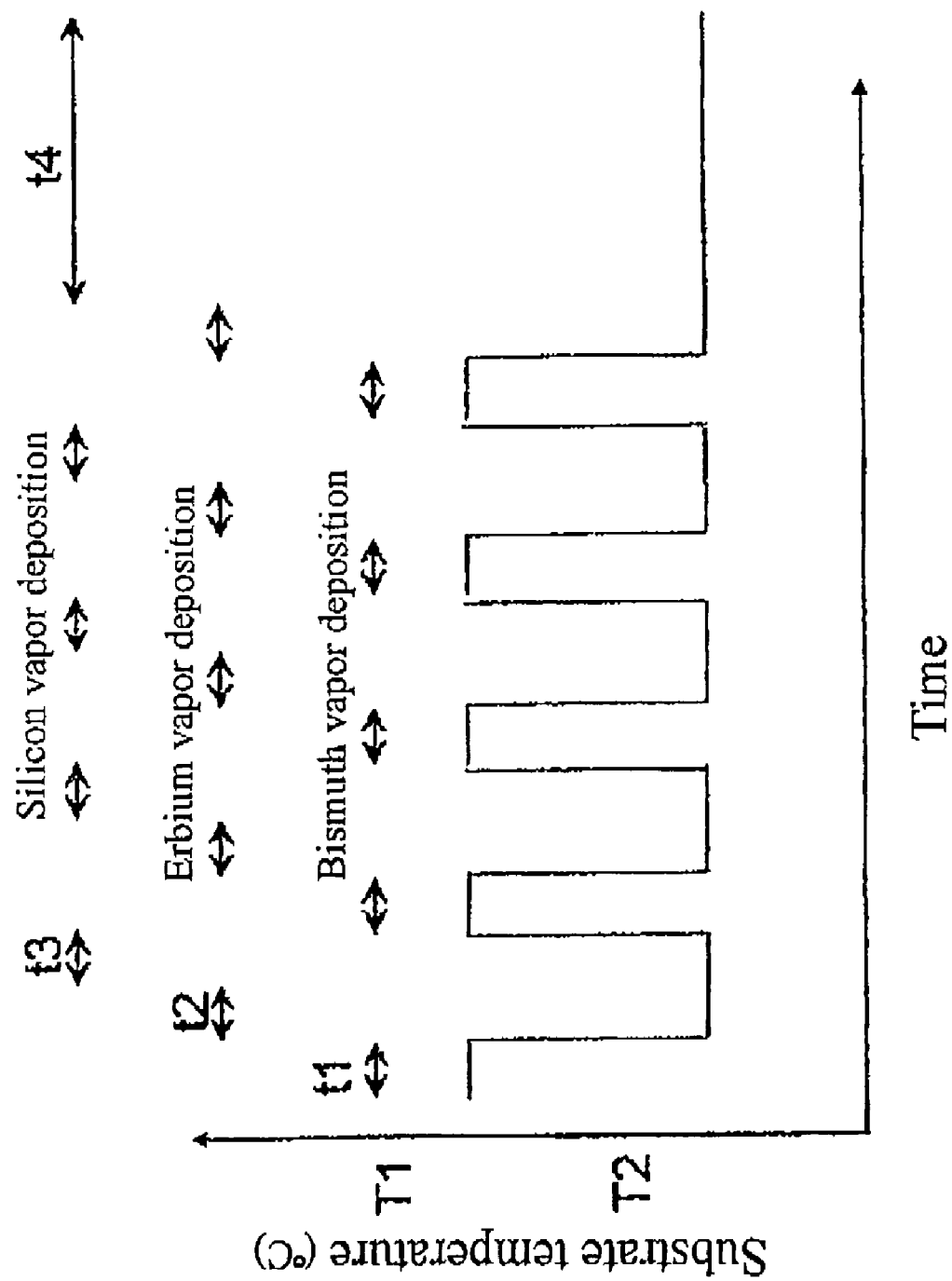
FIG. 13 is another example of the invention.

Other example is shown in FIG. 13. The constitution is different from the examples described above in that the superimposed doping layer is formed repetitively. This is an effective means in a case of attaining a desired amount by repetition when the dopant amount of the superimposed doping layer is insufficient when applied for once, or intending to obtain doping at a certain concentration over a considerable thickness. The cross sectional shape of the obtained doping structure is shown in FIG. 12.

This example has one important feature as the doping technique. That is, the repetition of a plurality of doping can be simply realized by merely changing the substrate temperature and controlling the vapor deposition amount in this patent. This contrasts to the δ-doping method and the ion implantation technique as the prior method, which require serious procedures even for conducting doping only by once. Control can be attained by using those described in the example with reference to FIG. 10 and FIG. 11 as the basic technique. After preparing bismuth atom thin lines on a silicon substrate, when other element is vapor deposited over the substrate, a superimposed doping layer of the bismuth element and other element can be formed. As described in the example with reference to FIG. 10 and FIG. 11, the doping amount of each element in the superimposed doping can be controlled by the vapor deposition amount of other element and the substrate temperature. The doping amount of each element in each superimposed doping can be controlled independently by changing the vapor deposition amount of other element and the substrate temperature on every formation of a plurality of doping layers. As described in the example with reference to FIG. 10 and FIG. 11, the silicon crystal growing rate can also be utilized for the control. In the example with reference to FIG. 10, FIG. 11, erbium was shown an example of other element but this is applicable to all elements in the group III or group V dopants and it was also confirmed that the element can be extended to two or more multi-elements.

Further, it is also important that an optional doping distribution can be attained. When the distribution is controlled by this method, it is also possible to suppress statistic fluctuation of the dopant in a fine silicon device which became an issue so far. The dopant fluctuation results in a problem in a case where the doping layer is thin, and electric characteristics change locally when the dopant is localized. For avoiding this, the statistic fluctuation can be eliminated effectively by preparing superimposed doping layers on every 1 nm at concentrations of $1 \times 10^{18}/cm^3$, $2 \times 10^{18}/cm^3$, $4 \times 10^{18}/cm^3$, $8 \times 10^{18}/cm^3$, and $1.6 \times 10^{19}/cm^3$. Since the superimposed doping is doping at the level of the atomic layer, a high density layer with less fluctuations is formed near the doping depth. A necessary doping concentration is adjusted by inserting a silicon layer as a spacer layer between superimposed dopings. By preparing layers with the change of the doping concentration in superimposed doping, a high concentration dopant layer can be spaced apart from the vicinity of a silicon oxide film where the dopant tends to be withdrawn. For the superimposed doping layer, a dopant concentration capable of effectively canceling strains and at high density can be realized by superimposed doping of a bismuth element and a phosphor element. In such example, while the bismuth vapor deposition time t1, phosphorus vapor deposition time t2, silicon vapor deposition time t3, substrate temperature T1 upon bismuth vapor deposition, and substrate temperature T2 upon vapor deposition of phosphor and silicon are fixed, this can be attained by adopting optional values as desired.

In the process shown in FIG. 13, the silicon growing time t4 and the substrate temperature upon vapor deposition are important steps when considering elimination of the surface segregation layer SSL. The elimination process has already been described in the example with reference to FIG. 8. In the chemical etching or dry etching for eliminating the surface segregation layer SSL, since the surface silicon layer is eliminated by etching, the silicon growing time t4 has to be decided while considering the film thickness by so much. Further, since the surface segregation is promoted further as the temperature is higher, it is desired to adopt a relatively high substrate temperature for T2 in order to attain a state with less dopant remaining in the silicon layer corresponding to the growing time t4. It may suffice that the temperature is sufficiently high when compared with 400° C.

Example 4

Figure 18:
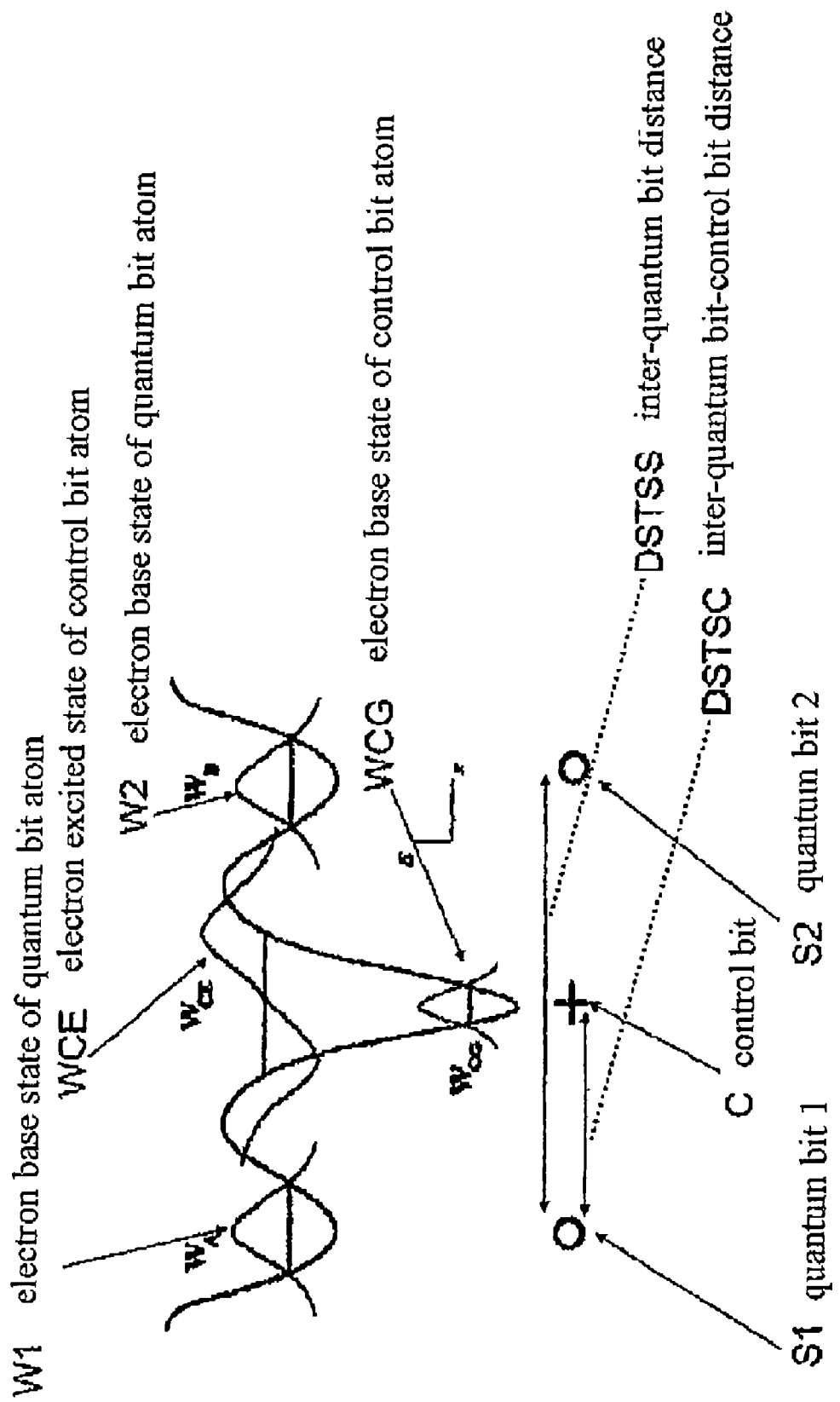
FIG. 18 is an predicted example by utilizing superimposed doping.
Figure 19:
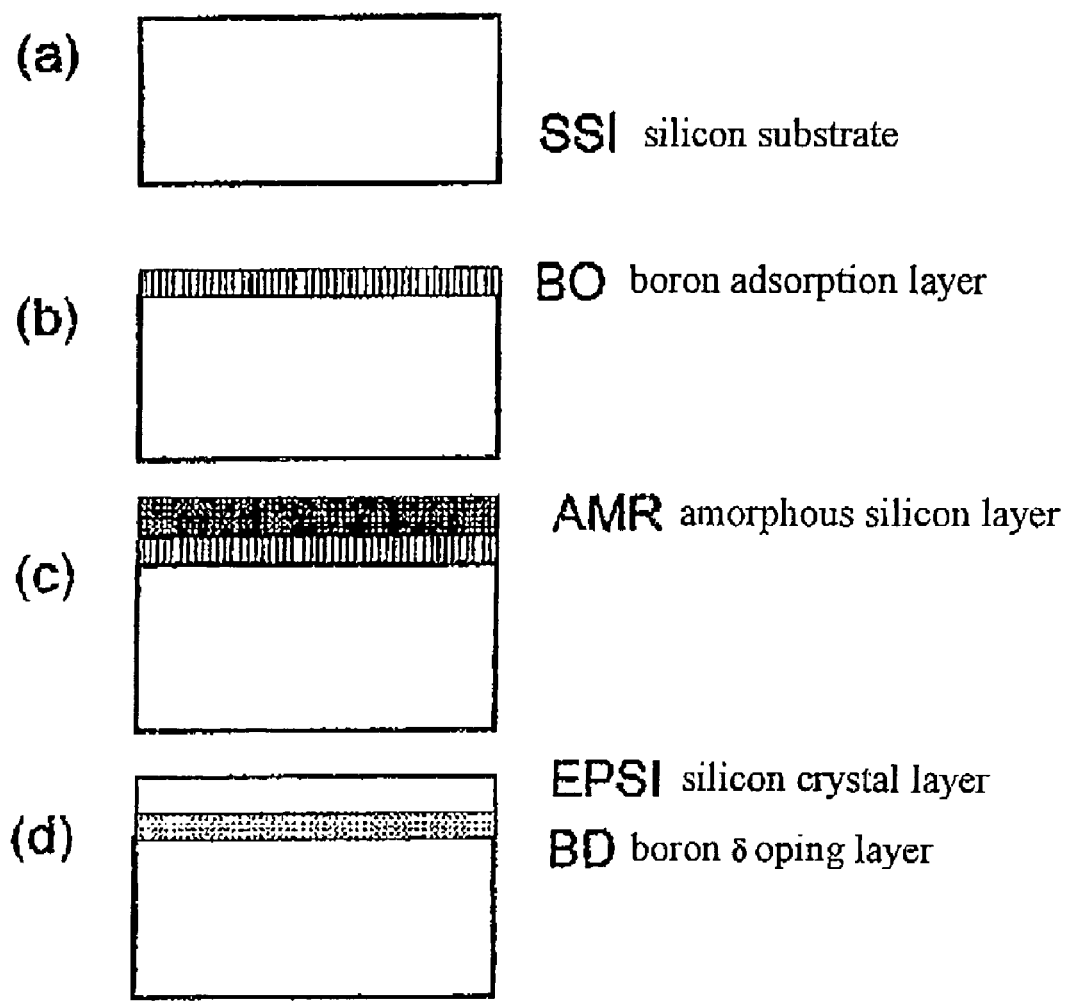
FIG. 19 is other existent example of doping.

As other example, the distribution width of the multi-element superimposed doping can be extended by further applying a high temperature heat treatment to a semiconductor device structure having the superimposed doping layer obtained in Example 1 or Example 3. In this case, the width for the concentration distribution of the dopant element can be increased to 20 nm or more. While the deviation of the peak position for the concentration distribution of the dopant element is also increased somewhat, the feature of superimposition can be maintained. An example of the effectiveness of this example, procedures for controlling the inter-bismuth atom distance and inter-bismuth element-erbium atom distance shown in FIG. 8 is increased. When the distance is 7 to 10 nm, the quantum information processing device shown in FIG. 18 can be realized. Also in addition to the bismuth atom and the erbium atom, the distribution width for other plural element superimposed doping can be extended. The annealing treatment was conducted by heating a silicon substrate containing the 2-element superimposed doping layer placed in a quartz tube by an external heater while flowing a nitrogen gas by 1 L/min at a normal pressure in the same manner as in the example with reference to FIG. 8. While the silicon substrate was placed on a quartz substrate holder, it was taken out together with the quartz substrate holder after the completion of heating to a place at an ambient temperature. In the annealing treatment conducted at 1200° C. for 40 sec, the width, that is, the dopant layer distribution was extended to 20 nm, that is, by about times compared with that at 1200° C. for 20 sec. In the case of the annealing treatment, prediction by numerical value simulation is also possible by utilizing the diffusion coefficient of the element in the superimposed doping layer. The annealing treatment can be conducted not restricted in the nitrogen gas stream but also in an inert gas such as an argon gas or a reduced gas such as a hydrogen gas. The flow rate of the gas may be higher or lower so long as the gas flows. Further, it can be conducted not being restricted to the heating in the quartz tube by the external heater, but also by a high speed annealing furnace. In the high speed annealing furnace utilizing an infrared ray image furnace, the conditions described above are the annealing condition at 1300° C. for about 2 sec.

Example 5

As other example, in a case of using Example 1, Example 3, or Example 4 for a magnetic semiconductor or a quantum information processing device, extra spin other than the superimposed doping layer can be eliminated. Spin ingredient of silicon can be eliminated from the silicon substrate SB and the epitaxial growing layer EP. For silicon, $^{29}$Si(4.7%) and $^{30}$Si(3.1%) having nuclear spin, and $^{28}$Si not having nuclear spin occur together in the natural world. $^{29}$Si(4.7%) and $^{30}$Si(3.1%) as the spin ingredient shorten the retention time by disturbing the spin state of quantum bits of a quantum information processing device. Accordingly, an epitaxially grown layer EP can be formed by using a silicon substrate SB in which for the concentration of $^{29}$Si(4.7%) and $^{30}$Si(3.1%) is lowered or using a silicon growing material in which the concentration of $^{29}$Si(4.7%) and $^{30}$Si(3.1%) is lowered. An isotope silicon at high purity can be prepared by laser isolation or the like and there is an example of a report for physical property experiment using a $^{28}$Si isotope at a concentration of 99.896% as described, for example, in the document: D. Kavaiskaj, et al., PHYSICAL REVIEW LETTERS, vol 86 (2001), pp 6010-6013. By using $^{28}$Si isotope crystals at high purity as the starting material for the material supply device 13a of the crystal growing apparatus 1 shown in FIG. 8, a silicon layer in which extra spin is eliminated can be attained by the same method as in all examples of the invention. When extra spin is eliminated from the silicon substrate, most of unnecessary spins can be eliminated. The crystal growing apparatus 1 in FIG. 8 is provided with a device for growing the dopant material such as the material supply device 13b or the material supply device 13c, and spin can be eliminated by utilizing an isotope of high purity like silicon. $^{28}$Si at 92.2% purity occurring in nature can be decreased by about two digits using $^{28}$Si isotope at 99.896% purity. Spin can be further eliminated by the development of a laser isolation technique.

Example 6

Figure 14:
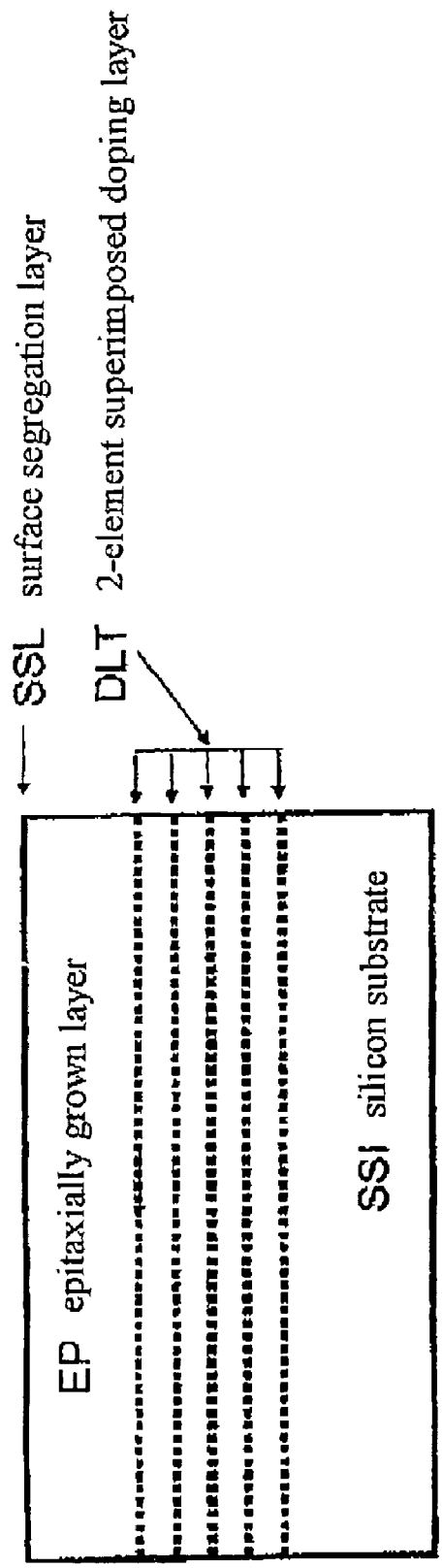
FIG. 14 is a cross sectional view of a specimen manufactured in another example of the invention.
Figure 15:
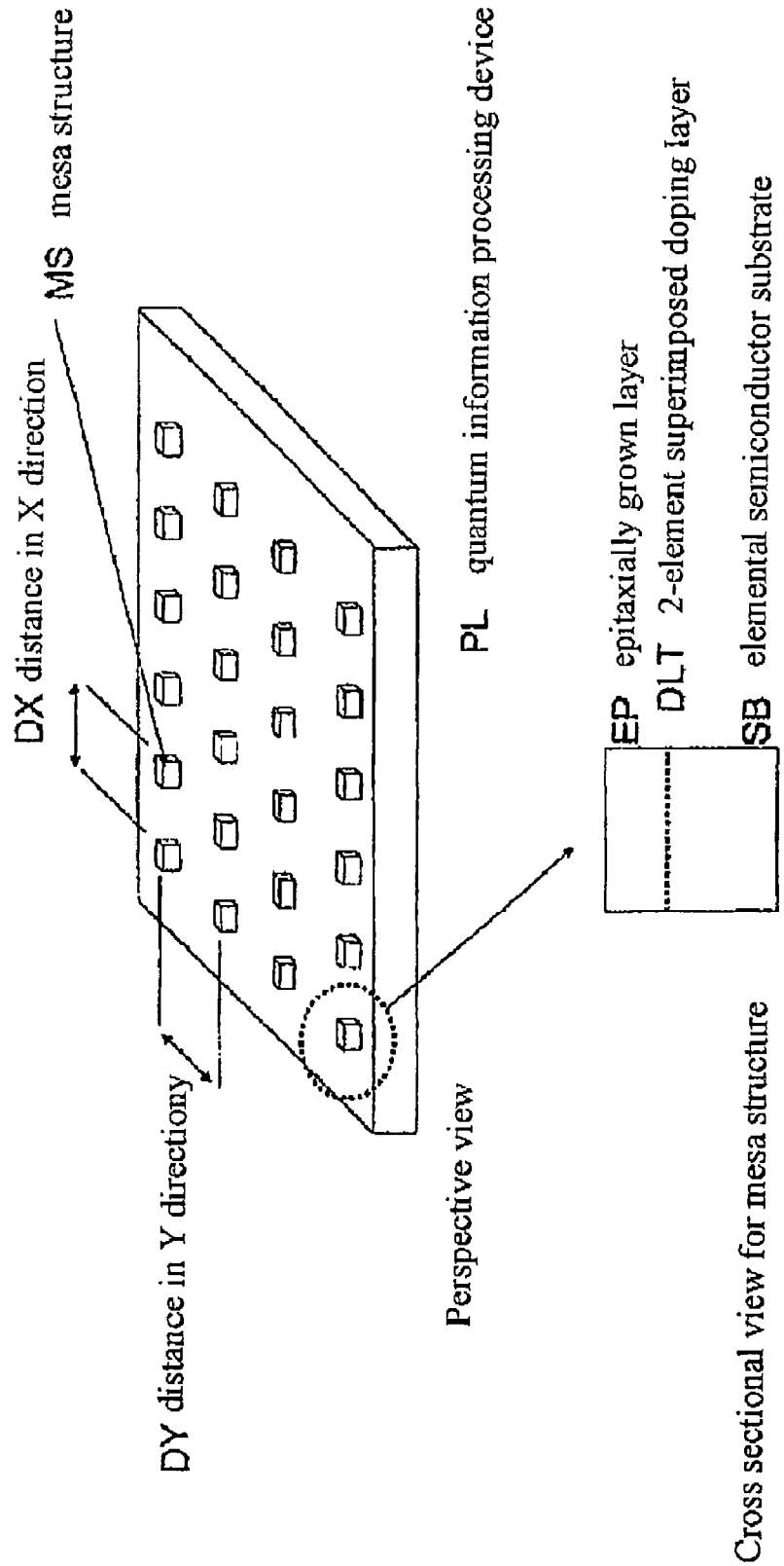
FIG. 15 is other example of the invention.
Figure 16:
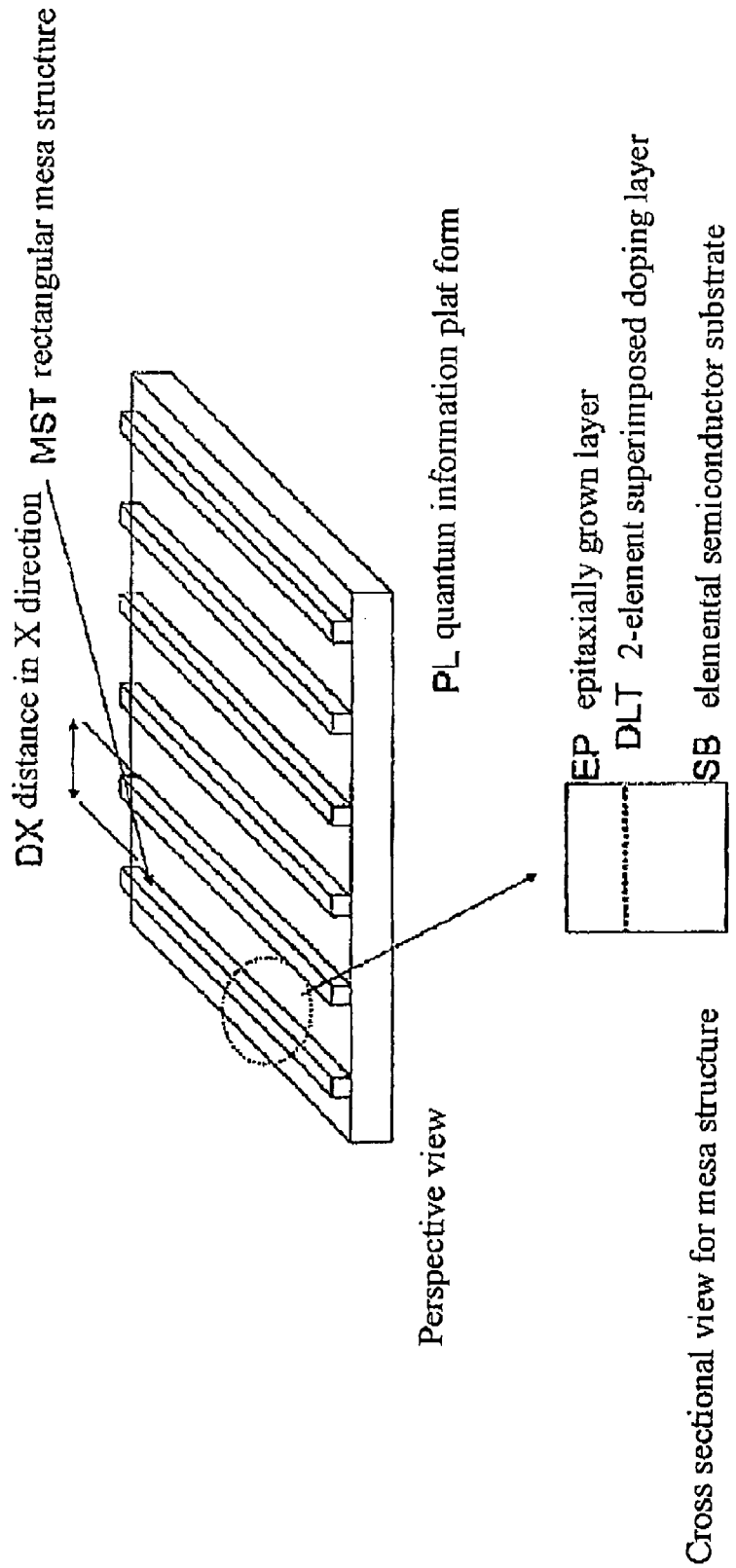
FIG. 16 is other example of the invention.
Figure 17:
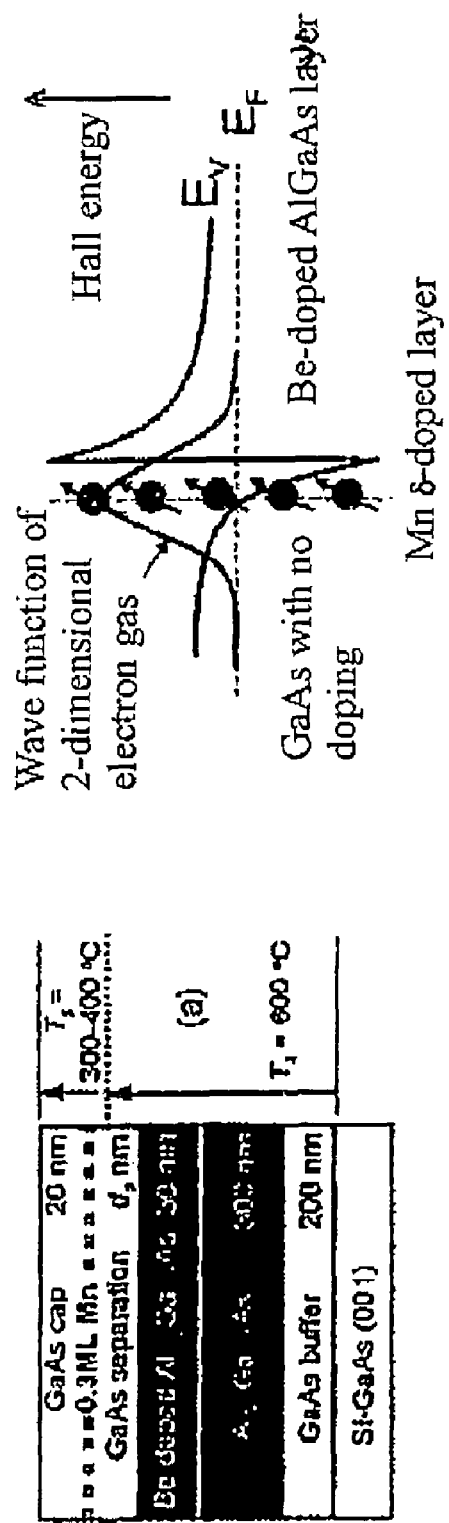
FIG. 17 is an existent example for doping.

As other example of the invention, in a case of using Example 1, Example 3, Example 4, or Example 5 as a quantum information processing device, a structure having mesa structure is effective. This example is shown in FIG. 15, and FIG. 16. This is an example of manufacturing a mesa structure by utilizing the structure of FIG. 1 or FIG. 14 shown in Example 1, Example 3, Example 4, or Example 5. As shown in the drawing, the mesa structure MS has a protruded structure of a cubic structure and can be manufactured by using a fine fabrication technique for semiconductors. Specifically, a photomask of a design capable of protecting only the mesa portion in FIG. 13 is provided and a silicon substrate having a superimposed doping layer is protected only for the mesa portion by a resist material by a photolithographic step. When a dry etching step is conducted in this state, portions other than the protected region are etched. Silicon etching was conducted under the conditions at 8 sccm of a $Cl_2$ gas, 2 sccm of a $CHF_3$ gas, under I Pa of a gas mixture pressure, with 500 W of plasma power and 50 W of bias power for a depth to 225 nm. Thus, a mesa structure of 200×200 nm and 225 nm height was formed. In the mesa structure MS, a 2-element superimposed doping layer structure DLT remains as shown in the cross sectional view, and the 2-element superimposed doping layer structure DLT is removed by an etching technique for the portions other than the mesa structure MS portion. Etching is also possible by a solution etching such as with NaOH or a mixed acid of hydrofluoric acid and nitric acid, and many methods have been developed also for dry etching.

In this example, a depth capable of removing the 2-element superimposed doping layer structure DLT may suffice for the depth to be removed by the etching. A mesa structure MS and a mesa structure adjacent therewith are spaced apart in the direction of axes XY at a distance DX in the direction X and at a distance DY in the direction Y. In a case of a quantum information processing device for conducting optical operation, it can be considered that device isolation referred to in an electronic device is attained so long as devices are spaced apart by about an optical wavelength.

When DX or DY is spaced apart by about the optical wave length, an optical beam direction or focus position can be designated independently. In a case of using a light at about 1 eV. DX or DY at a wavelength of about 1.24 μm is designated and identical quantum information processing can be conducted independently by separate mesa structures, that is, a plurality of quantum information processing is possible even by using an identical wavelength.

It is not always necessary that the mesa structure is in an illustrated rectangular form but a structure capable of being optically distinguished in both directions of axes X and Y may suffice. Further, a mesa structure having a space not in the directions X, Y but only in the direction X as shown in FIG. 16 may be used. Alternatively, it may suffice that the focus position of the optical axis can be designated in view of the space also in the direction of the axis of rotation.

Example 7

Over a silicon substrate, mixed crystals of 80% silicon and 20% germanium were crystallographically grown at 380° C., then a bismuth line structure was prepared at 600° C., antimony was vapor deposited by 1-atomic layer after lowering the temperature to 380° C., and then mixed crystals of 80% silicon and 20% germanium were epitaxially grown, thereby conducting superimposed doping. The concentration distribution of doping as in silicon was detected by secondary ion mass analysis. Further, germanium was grown at a rate of 1.2 molecule layer/min by using a K cell vapor deposition source. Vapor deposition was conducted for silicon and bismuth under the same conditions as those described above, and antimony was grown at a rate of 0.1 molecule/min for 10 min by using a K cell vapor deposition source.

The invention claimed is:

1. A semiconductor device, comprising:
a semiconductor substrate comprised of an elemental semiconductor; and
at least two kinds of element dopants included in the semiconductor substrate to form a doping layer, the two kinds of element dopants being respectively a group III element and a group V element, both group V elements, or a group V element and a rare earth element,
wherein both of the two kinds of element dopants have a half-value width of 20 nm or less for a concentration, and a deviation between concentration peak positions of the two element dopants is within 2 nm, both of the two kinds of element dopants also being electrically or optically active.

2. The semiconductor device according to claim 1, wherein one element dopant generates compressive strain to a lattice constant of the elemental semiconductor of the semiconductor substrate, and another element dopant generates an expansion strain with respect to the compression strain.

3. The semiconductor device according to claim 1, wherein the doping layer includes two or more element dopants.

4. The semiconductor device according to claim 1, wherein the elemental semiconductor is a group IV semiconductor.

5. The semiconductor device according to claim 4, wherein the group IV semiconductor is a silicon crystal or a group IV mixed crystal semiconductor containing a silicon element.

6. The semiconductor device according to claim 1, wherein a concentration of a nuclear spin isotope element in the semiconductor substrate is lower than an average concentration of a nuclear spin isotope element found in nature in a semiconductor substrate, other than the doping layer.

7. The semiconductor device according to claim 1, wherein one of dopant element is a bismuth element.

8. The semiconductor device according to claim 1, wherein one or more mesa structure containing the doping layer is present within a plane, and a distance between the mesa structure and an adjacent mesa structure is about or more than an optical wavelength.

9. The semiconductor device according to claim 1, wherein a spin ingredient in a portion other than the doping layer is eliminated from the semiconductor substrate.

10. A method for producing a semiconductor device in which two kinds of element dopants are included in a semiconductor substrate that is comprised of an elemental semiconductor, the two kinds of element dopants being respectively a group III element and a group V element, both group V elements, or a group V element and a rare earth element, the method comprising:
vapor depositing a first kind of element dopant above the semiconductor substrate so as to evaporate a (2×n) structure thereof and form a thin line structure thereof;
vapor depositing a second kind of element dopant above the semiconductor substrate provided with the thin line structure of the first kind of element dopant;
epitaxially growing a semiconductor crystal layer over the semiconductor substrate vapor deposited with the first and second kinds of element dopants to form a doping layer; and
applying a high temperature annealing to the doping layer, thereby activating the first and second kinds of element dopants electrically or optically.

11. The method for producing a semiconductor device according to claim 10, wherein that the first kind of element dopant is bismuth.

12. The method for producing a semiconductor device according to claim 10, further comprising:
evaporating the (2×n) structure upon vapor deposition or after vapor deposition of the first kind of element dopant, and heating the substrate to a temperature forming the thin line structure.

13. The method for producing a semiconductor device according to claim 12, further comprising:
repeating steps of vapor deposition of the first kind of element dopant to the high temperature annealing several times so as to provide a plurality of doping layers and a plurality of semiconductor crystal layers.

14. The method for producing a semiconductor device according to claim 13, further comprising:
applying a high temperature treatment to the semiconductor substrate having a plurality of doping layers and a plurality of semiconductor crystal layers, thereby extending a width of a doping distribution.

15. the method for producing a semiconductor device according to claim 10, wherein the semiconductor crystal layer is a group IV semiconductor.

16. The method for producing a semiconductor device according to claim 15, wherein the group IV semiconductor is silicon.

* * * * *